United States Patent [19]

Antill et al.

[11] Patent Number: 5,297,236

[45] Date of Patent: Mar. 22, 1994

[54] LOW COMPUTATIONAL-COMPLEXITY DIGITAL FILTER BANK FOR ENCODER, DECODER, AND ENCODER/DECODER

[75] Inventors: Michael B. Antill, San Rafael; Grant A. Davidson, Oakland, both of Calif.

[73] Assignee: Dolby Laboratories Licensing Corporation, San Francisco, Calif.

[21] Appl. No.: 710,805

[22] Filed: Jun. 5, 1991

Related U.S. Application Data

[63] Continuation-in-part of Ser. No. 508,809, Apr. 12, 1990, abandoned, and Ser. No. 458,894, Dec. 12, 1989, Pat. No. 5,109,417, which is a continuation-in-part of Ser. No. 303,714, Jan. 27, 1989, abandoned.

[51] Int. Cl.$^5$ .............................................. G10L 9/00
[52] U.S. Cl. .................................................. 395/2.12
[58] Field of Search ................................. 381/29–46; 395/2.12

[56] References Cited

U.S. PATENT DOCUMENTS

5,109,417 4/1992 Fielder et al. ...................... 381/36

FOREIGN PATENT DOCUMENTS

9116769 10/1991 World Int. Prop. O. .

OTHER PUBLICATIONS

Brigham, *The Fast Fourier Transform*, Englewood Cliffs, N.J.: Prentice-Hall, Inc., 1974, pp. 166–167.
Oppenheim and Schafer, *Digital Signal Processing*, Englewood Cliffs, N.J.: Prentice-Hall, Inc., 1975, pp. 307–314.
Harris, "On the Use of Windows for Harmonic Analysis with the Discrete Fourier Transform," *Proc. IEEE*, vol. 66, Jan., 1978, pp. 51–83.
Narasimha and Peterson, "On the Computation of the Discrete Cosine Transform," *IEEE Trans. Communications*, COM-26, Jun., 1978, pp. 934–936.
Tribolet and Crochiere, "Frequency Domain Coding of Speech," *IEEE Trans. Acoust., Speech, Signal Proc.*, ASSP-27, Oct., 1979, pp. 512–530.
Jayant and Noll, *Digital Coding of Waveforms*, Englewood Cliffs, N.J.: Prentice-Hall, Inc., 1984, pp. 563–576.
Princen, Bradley, "Analysis/Synthesis Filter Bank Design Based on Time Domain Aliasing Cancellation," *IEEE Trans.*, ASSP-34, 1986, pp. 1153–1161.
Princen, Johnson, Bradley, "Subband/Transform Coding Using Filter Bank Designs Based on [TDAC]," *ICASSP 1987 Conf. Proc.*, May 1987, pp. 2161–2164.
Edler, "Coding of Audio Signals with Overlapping Block Transform and Adaptive Window Functions," *Frequenz*, vol. 43, No. 9, 1989, pp. 252–256.
Malvar, "Lapped Transforms for Efficient Transform-/Subband Coding," *IEEE Trans. Acoust., Speech, Signal Proc.*, ASSP-38, Jun., 1990, pp. 969–978.
Gluth, "Regular FFT-Related Transform Kernels for DCT/DST-Based Polyphase Filter Banks," *ICASSP 1991 Conf. Proc.*, vol. 3, May 1991, pp. 2205–2208.
Duhamel, Mahieux, and Petit, "A Fast Algorithm for the Implementation of Filter Banks Based on [TDAC]," *ICASSP 1991 Conf. Proc.*, May 1991, pp. 2209–2212.
Vetterli, "Perfect Reconstruction FIR Filter Banks: Some Properties and Factorizations", Jul. 1989, pp. 1057–1071, IEEE Transactions on Acoustics, Speech and Signal Processing.
Barnwell, "Filter Banks for Analysis-Reconstruction Systems: A Tutorial," May 1990, pp. 1999–2003, IEEE Int. Symp. on CAS.

*Primary Examiner*—Allen R. MacDonald
*Assistant Examiner*—Michelle Doerrler
*Attorney, Agent, or Firm*—Thomas A. Gallagher; David N. Lathrop

[57] ABSTRACT

The invention relates in general to digital encoding and decoding of information. More particularly, the invention relates to efficient implementation of digital analysis and synthesis filter banks used in encoding and decoding. The invention permits the length of a digital transform used to implement critically-sampled analysis and synthesis filter banks to be adaptively selected.

34 Claims, 6 Drawing Sheets

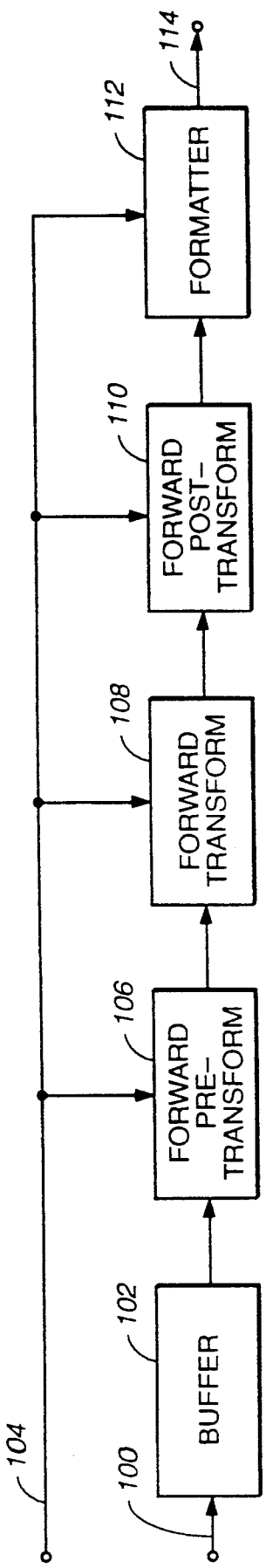
FIG._1
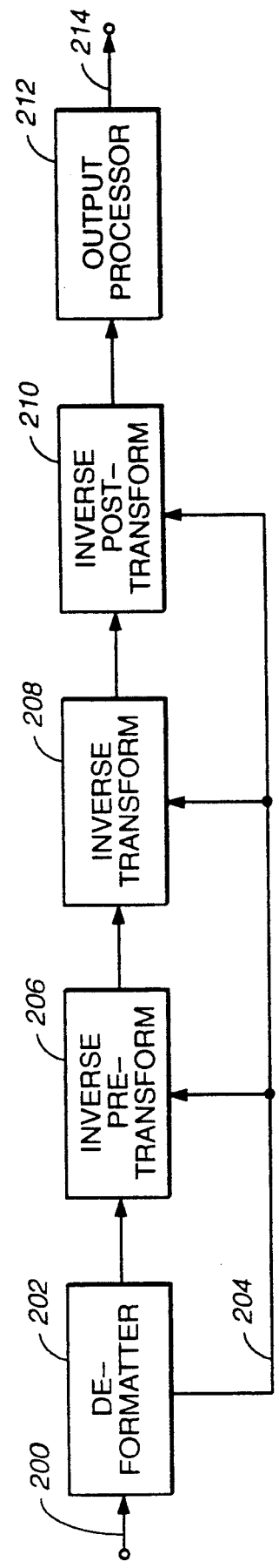
FIG._2

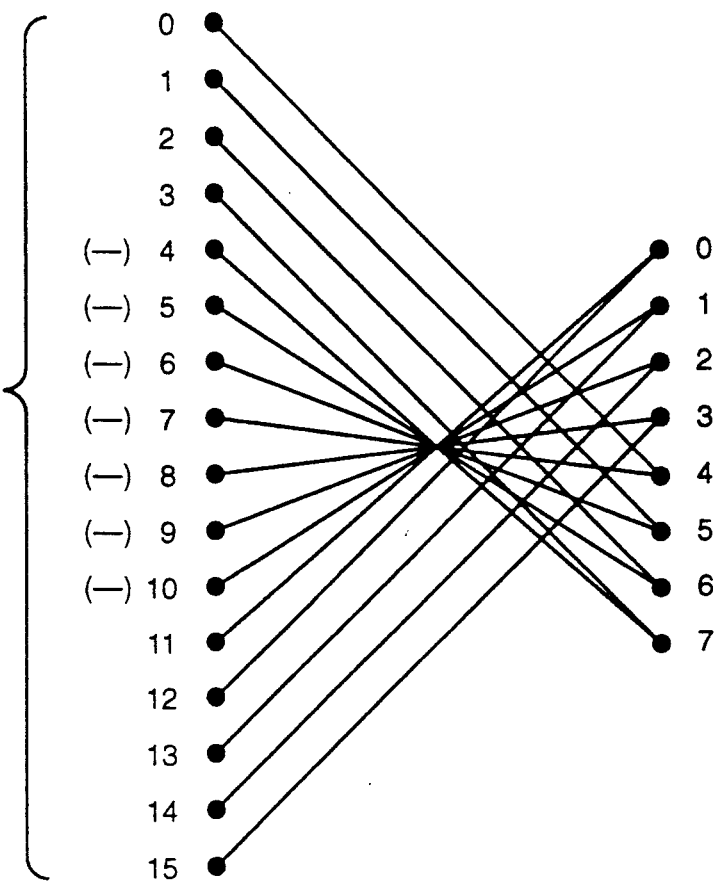
FIG._3
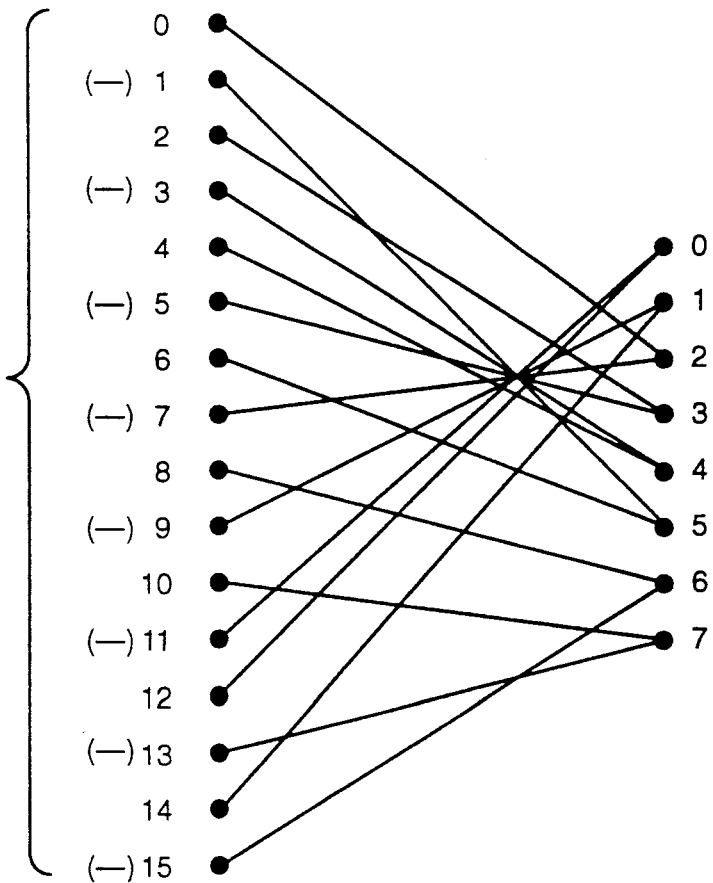
FIG._4

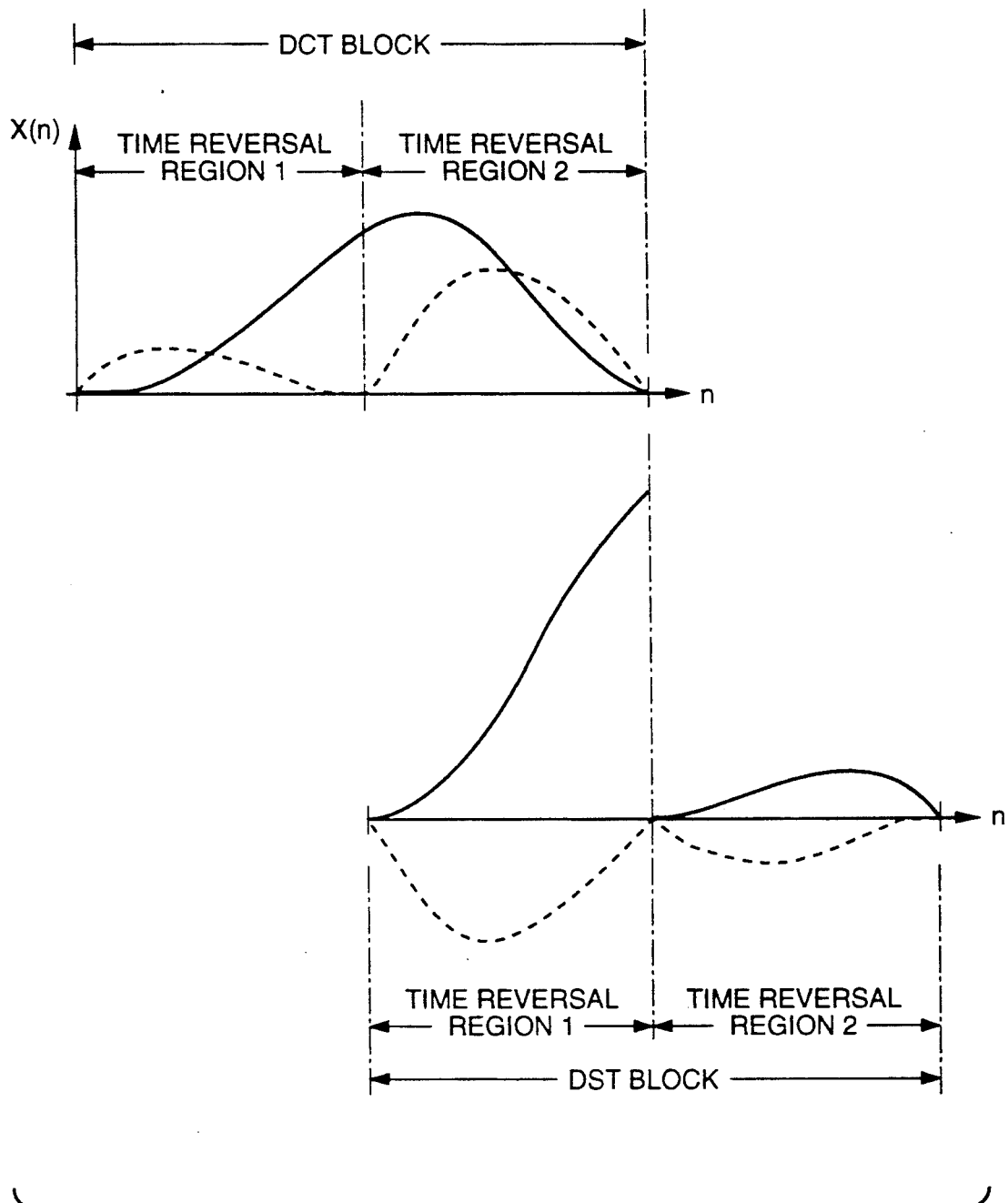
FIG._5

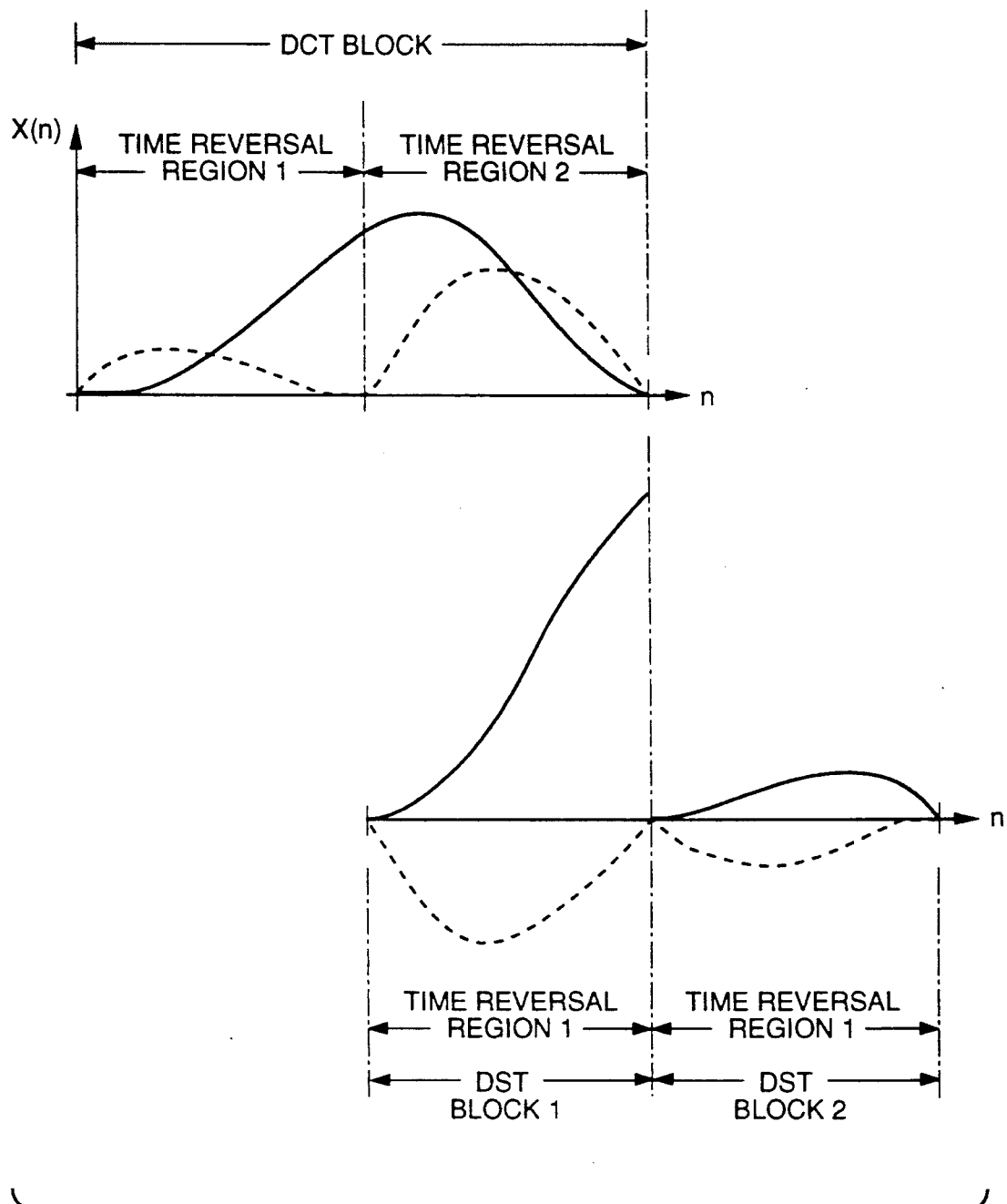
FIG._6

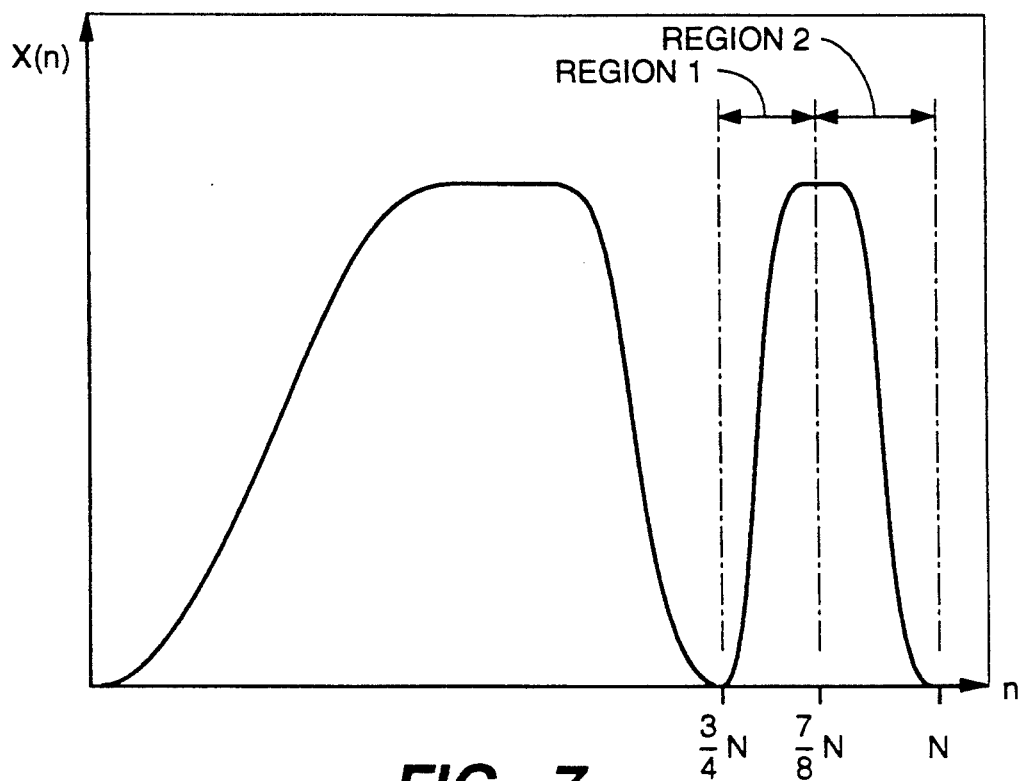
FIG._7
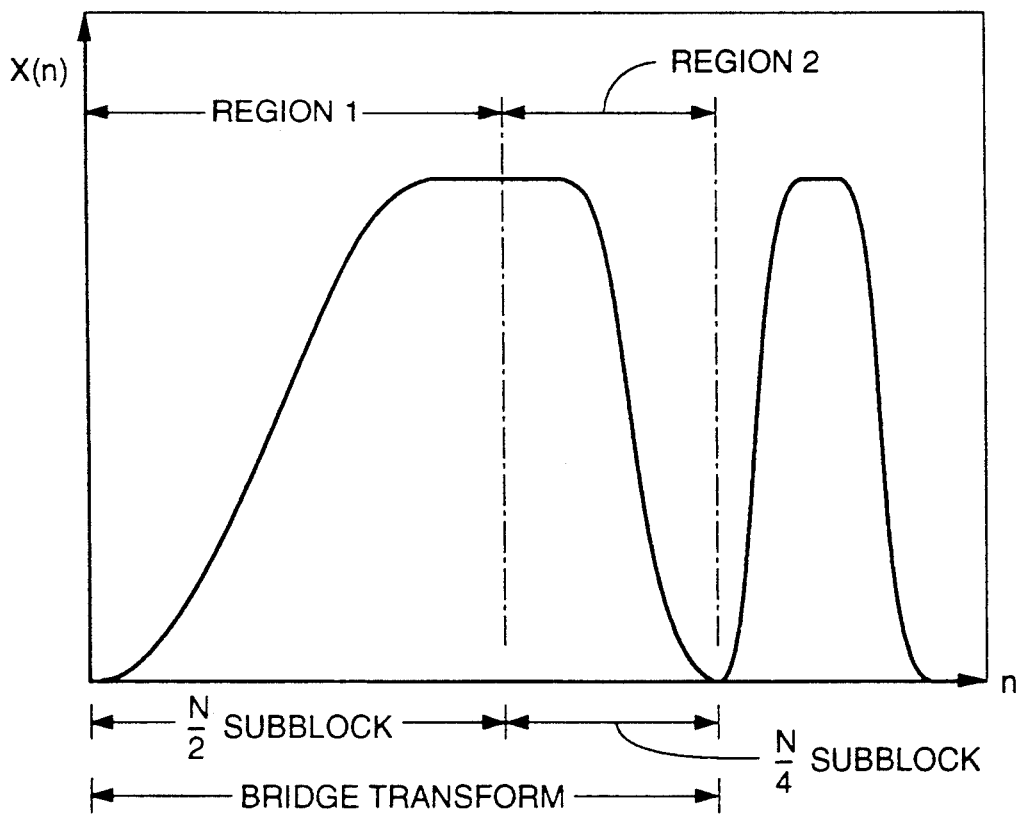
FIG._8

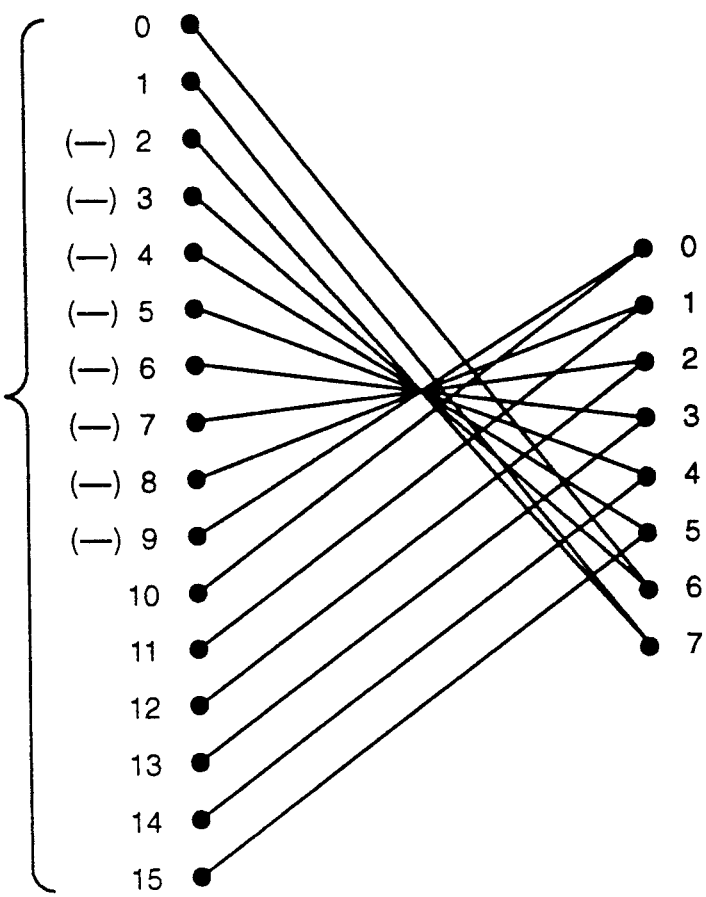
FIG._9
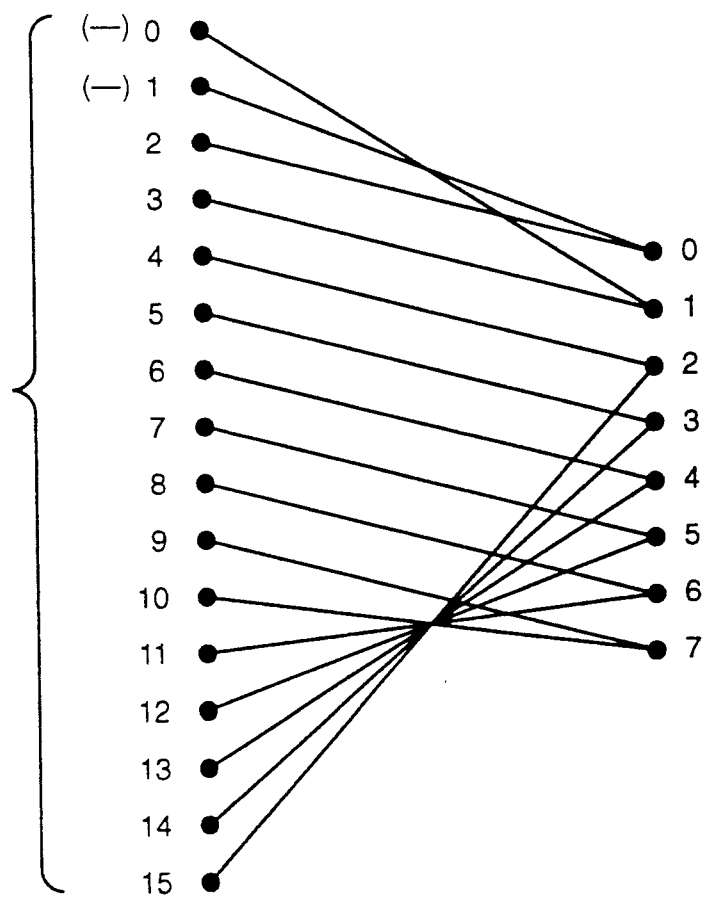
FIG._10

LOW COMPUTATIONAL-COMPLEXITY DIGITAL FILTER BANK FOR ENCODER, DECODER, AND ENCODER/DECODER

CROSS-REFERENCE TO RELATED APPLICATIONS

This application is a continuation-in-part of copending U.S. application Ser. No. 07/458,894, filed Dec. 12, 1989, now U.S. Pat. No. 5,109,417, which was a continuation-in-part of U.S. application Ser. No. 07/303,714, filed Jan. 27, 1989, now abandoned a continuation-in-part of copending U.S. application Ser. No. 07/508,809, filed Apr. 12, 1990, now abandoned and a continuation-in-part of copending PCT/US91/02512, filed Apr. 12, 1991.

TECHNICAL FIELD

The invention relates in general to digital encoding and decoding of information. More particularly, the invention relates to efficient implementation of digital analysis and synthesis filter banks used in digital encoding and decoding. In a preferred embodiment of the invention, the length of the filter bank used to implement critically-sampled analysis and synthesis filter banks may be adaptively selected.

Throughout the following discussion and especially in the background discussion, more particular mention will be made of audio applications, however, it should be understood that the present invention is applicable to a range of digital coding applications wider than just that of audio encoding and decoding.

BACKGROUND ART

Introduction

There is considerable interest among those in the field of signal processing to develop efficient means to transmit or store information. Improving coding efficiency includes (1) reducing informational requirements, that is, reducing the amount of information required to adequately represent a signal during transmission or storage, and (2) reducing processing requirements, that is, reducing the amount of processing required to implement the encoding and decoding processes.

In high-quality audio coding applications, informational requirements can sometimes be reduced without loss of perceptible audio quality by exploiting various psychoacoustic effects. Signal recording, transmitting, or reproducing techniques which divide the useful signal bandwidth into narrow bands with bandwidths approximating the human ear's critical bands can exploit psychoacoustic masking effects. Such techniques divide the signal bandwidth with an analysis filter bank, process the signal passed by each filter band, and reconstruct a replica of the original signal with a synthesis filter bank.

Two common coding techniques are subband coding and transform coding. Subband coders and transform coders can reduce the informational requirements in particular frequency bands where the noise caused by the resulting coding inaccuracy is psychoacoustically masked. Subband coders may be implemented by a bank of digital bandpass filters defining subbands of varying bandwidth. Transform coders may be implemented by any of several time-domain to frequency-domain transforms. One or more adjacent transform coefficients are grouped together to define "subbands" having effective bandwidths which are sums of individual transform coefficient bandwidths.

The mathematical basis for digital subband filter banks and digital block transforms is essentially the same. See Tribolet and Crochiere, "Frequency Domain Coding of Speech," *IEEE Trans. Acoust., Speech, and Signal Proc.*, ASSP-27, October, 1979, pp. 512–30. Therefore, throughout the following discussion, the term "subband coder" shall refer to both a true subband coder and a transform coder. The term "subband" shall refer to portions of the useful signal bandwidth whether implemented by a true subband coder or a transform coder. The terms "transform" and "transforming" shall include digital filters and digital filtering, respectively.

In most digital coding applications, processing requirements can be reduced by increasing the efficiency of subband filtering. Improved processing efficiency permits implementation of encoders and decoders which are less expensive to build, or which impose lower signal propagation delays through an encoder/decoder system.

In many subband coder systems, the analysis and synthesis filter banks are implemented by discrete time-domain to frequency-domain transforms such as the Discrete Fourier Transform (DFT), the Discrete Cosine Transform (DCT), and the Discrete Sine Transform (DST). The number of time-domain signal samples, referred to herein as the time-domain signal sample block length, processed by such transforms is sometimes called the transform length, and the amount of processing required to perform these transforms is generally proportional to the square of the time-domain signal sample block length.

The number of frequency-domain transform coefficients generated by a transform is also sometimes called the transform length. It is common for the number of frequency-domain transform coefficients generated by the transform to be equal to the time-domain signal sample block length, but this equality is not necessary. For example, one transform referred to herein as the E-TDAC transform is sometimes described in the art as a transform of length $\frac{1}{2}N$ that transforms signal sample blocks with a length of N samples. It is possible, however, to also describe the transform as one of length N which generates only $\frac{1}{2}N$ unique frequency-domain transform coefficients. Thus, in this discussion the time-domain signal sample block length and the discrete transform length are generally assumed to be synonyms.

Various techniques have been utilized to reduce the amount of time required to perform a transform, or to reduce the processing power required to perform a transform in given amount of time, or both. One technique is taught in Narashima and Peterson, "On the Computation of the Discrete Cosine Transform," *IEEE Trans. on Communications*, COM-26, June, 1978, pp. 934–36. Briefly, this technique evaluates an N-point DCT by rearranging or "shuffling" the samples representing the input signal, performing an N-point DFT on the shuffled samples, and multiplying the result with a complex function. It is approximately twice as efficient as other techniques using a 2N-point FFT, however, Narashima and Peterson only teach how to improve the efficiency of filter banks implemented by one particular DCT.

Another technique which yields approximately a two-fold increase in processing efficiency concurrently performs two real-valued discrete transforms of length N with a single complex-valued FFT of length N. A subband coder utilizing this technique to concurrently perform a modified DCT with a modified DST is described in International Patent Application PCT/US 90/00501, Publication No. WO 90/09022 (published Aug. 9, 1990). The significance of these modified DCT and modified DST is discussed in Princen and Bradley, "Analysis/Synthesis Filter Barik Design Based on Time Domain Aliasing Cancellation," *IEEE Trans. on Acoust., Speech, Signal Proc.*, ASSP-34, 1986, pp. 1153–1161. The authors describe a specific application of these transforms as the time-domain equivalent of an evenly-stacked critically-sampled single-sideband analysis-synthesis system. They are referred to collectively herein as the Evenly-stacked Time-Domain Aliasing Cancellation (E-TDAC) transform.

Another technique to reduce processing requirements is taught by Malvar, "Lapped Transforms for Efficient Transform/Subband Coding," *IEEE Trans. Acoust., Speech, Signal Proc.*, ASSP-38, June, 1980, pp. 969–78. This technique implements an N-point modified DCT by performing a ½N-point DST after combining pairs of the samples representing the input signal, or "folding" the N input signal samples into a smaller set of ½N points. It is approximately twice as efficient as performing the modified DCT in a straight-forward manner, however, Malvar only teaches how to fold input samples for a filter bank implemented by one specific modified DCT whose input samples have been weighted by a specific sine-tapered analysis window.

The specific modified DCT implemented by Malvar is discussed in greater detail by Princen, Johnson, and Bradley, "Subband/Transform Coding Using Filter Bank Designs Based on Time Domain Aliasing Cancellation," ICASSP 1987 Conf Proc., May 1987, pp. 2161–64. The authors describe this transform as the time-domain equivalent of an oddly-stacked critically sampled single-sideband analysis-synthesis system. It is referred to herein as the Oddly-stacked Time-Domain Aliasing Cancellation (O-TDAC) transform.

It is desirable to implement encoders and decoders with the ability to use different time-domain signal sample block lengths in order to optimize coder performance. It is well known in the art that longer time-domain signal sample block lengths improve the selectivity or frequency-resolving power of subband coders, and better filter selectivity generally improves the ability of a subband coder to exploit psychoacoustic masking effects. See International Patent Application PCT/US 90/00507, Publication No. WO 90/09064 (published Aug. 9, 1990) which discusses the importance of time-domain signal sample block length and subband filter selectivity.

But longer time-domain signal sample block lengths degrade the time-resolution of a subband filter bank. Inadequate time-resolution can produce audible distortion artifacts when quantizing errors of signal events, such as transients, producing pretransient and post-transient ringing which exceed the ear's temporal psychoacoustic masking interval. See for example, Edler, "Coding of Audio Signals with Overlapping Block Transform and Adaptive Window Functions," *Frequenz*, vol. 43, no. 9, 1989, pp. 252–56. Hence, it is desirable that techniques which improve subband filter bank processing efficiency should also permit adaptive selection of the time-domain signal sample block length.

DISCLOSURE OF INVENTION

It is an object of the present invention to provide a subband encoder and a subband decoder of digital information by means of analysis filtering and synthesis filtering requiring lower processing requirements, or imposing lower processing delays, or both.

It is another object of the present invention to provide a subband encoder and a subband decoder of digital information requiring lower processing requirements, or imposing lower processing delays, or both, by means of analysis filtering and synthesis filtering permitting adaptive selection of the filter-bank length.

Further details of the above objects and still other objects of the invention are set forth throughout this document, particularly in the Detailed Description of the Invention, below.

In accordance with the teachings of the present invention in one embodiment, an encoder provides for the encoding of input signal samples corresponding to an analog signal. The input samples are buffered into time-domain signal sample blocks. Pairs of signal samples in the time-domain signal sample blocks are combined to produced modified samples. Frequency-domain transform coefficients are generated by a discrete digital transform in response to the modified samples. Quantized information is generated in response to the frequency-domain transform coefficients. Digital information including the quantized information is assembled into a format suitable for transmission or storage.

Also in accordance with the teachings of the present invention in one embodiment, a decoder provides for the decoding of digitally encoded information. Quantized information is extracted from the digitally encoded signal. Frequency-domain transform coefficients are generated in response to the extracted quantized information. Time-domain transform coefficients are generated by an inverse discrete digital transform in response to the frequency-domain transform coefficients. Signal samples are generated in response to the time-domain transform coefficients, and output samples are generated which correspond to the input samples to a companion encoder.

Further in accordance with the teachings of the present invention in one embodiment, an encoder/decoder system provides for the encoding of input signal samples corresponding to an analog signal, and for the decoding of a digitally encoded signal. For encoding, the input samples are buffered into signal sample blocks. Pairs of signal samples in the signal sample blocks are combined to produced modified samples. Frequency-domain transform coefficients are generated by a discrete digital transform in response to the modified samples. Quantized information is generated in response to the frequency-domain transform coefficients. Digital information including the quantized information is assembled into a format suitable for transmission or storage. For decoding, quantized information is extracted from a digitally encoded signal. Frequency-domain transform coefficients are generated in response to the extracted quantized information. Time-domain transform coefficients are generated by an inverse discrete digital transform in response to the frequency-domain transform coefficients. Signal samples are generated in response to the time-domain transform coefficients, and output samples are generated which correspond to the input samples to a companion encoder.

The various features of the present invention and its preferred embodiments are set forth in greater detail in the following Detailed Description of the Invention and in the accompanying drawings.

BRIEF DESCRIPTION OF DRAWINGS

FIGS. 1 and 2 are functional block diagrams illustrating the basic functional structure of a preferred embodiment of the present invention.

FIG. 3 is a flowgraph illustrating the forward pretransform function, applied to a 16-sample time-domain signal sample block to form an 8-sample modified sample block, for a basic embodiment of the present invention permitting implementation of an E-TDAC transform analysis filter bank by a DCT and DST.

FIG. 4 is a flowgraph illustrating the forward pretransform function, applied to a 16-sample time-domain signal sample block to form an 8-sample modified sample block, for an alternative embodiment of the present invention permitting implementation of an E-TDAC transform analysis filter bank by a DFT.

FIG. 5 is a hypothetical raphical representation illustrating the time-reversal regions of the time-domain aliasing component created by the E-TDAC transform using the conventional phase term.

FIG. 6 is a hypothetical graphical representation illustrating the time-reversal regions of the time-domain aliasing component created by the E-TDAC transform using the phase term required to cancel time-domain aliasing in an N-sample length block overlapped with a subsequent ½N-sample length block.

FIG. 7 is a hypothetical graphical representation illustrating the boundary between time-reversal regions of the time-domain aliasing component in a ½N-sample length block.

FIG. 8 is a hypothetical graphical representation of a bridge transform, illustrating the time-reversal regions of the time-domain aliasing component.

FIG. 9 is a flowgraph illustrating the forward pretransform function, applied to a 16-sample time-domain signal sample block to form an 8-sample modified sample block, permitting implementation of an adaptive-length E-TDAC transform analysis filter bank by a DCT and DST.

FIG. 10 is a flowgraph illustrating the forward pretransform function, applied to a 16-sample time-domain signal sample block to form an 8-sample modified sample block, permitting implementation of an adaptive-length O-TDAC transform analysis filter bank by a DST.

DETAILED DESCRIPTION OF THE INVENTION

1. Overview of Functional Structure

FIGS. 1 and 2 show the basic functional structure of a preferred embodiment of the present invention. According to this embodiment, as shown in FIG. 1, an encoder comprises buffer 102 which buffers input samples received from input path 100 into time-domain signal sample blocks, forward pretransform 106 which generates modified samples in response to signal samples received from buffer 102 and in response to information received from path 104 establishing the number of signal samples constituting a time-domain signal sample block, forward transform 108 which transforms the modified samples into frequency-domain transform coefficients using a transform whose length is adapted in response to information received from input path 104, forward post-transform 110 which generates quantized information in response to the frequency-domain transform coefficients and the information received from path 104, and formatter 112 which assembles digital information including the quantized information into a form suitable for transmission or storage along path 114. The functions performed by buffer 102 and formatter 112 are not discussed in detail herein.

A preferred embodiment of a decoder, as shown in FIG. 2, comprises deformatter 202 which extracts quantized information and information establishing the inverse transform length from the encoded digital signal received from path 200, inverse pretransform 206 which generates frequency-domain transform coefficients in response to the extracted quantized information and the information establishing the inverse transform length received along path 204, inverse transform 208 which transforms the frequency-domain transform coefficients into time-domain transform coefficients using a transform whose length is adapted in response to information received from path 204, inverse post-transform 210 which generates signal samples in response to the time-domain transform coefficients and information received from path 204, and output processor 212 which generates along path 214 output samples corresponding to the input samples to a companion encoder in response to the signal samples. The functions performed by deformatter 202 and output processor 212 are not discussed in detail herein.

A basic embodiment of the present invention is introduced in some detail before alternative embodiments are discussed. This basic embodiment uses fixed-length E-TDAC transforms to implement the analysis and synthesis filter banks. Preferred embodiments of various features are described throughout the discussion.

II. Basic Embodiment of Invention

A. Input Sample Buffering

A buffer, represented by box 102 in FIG. 1, receives signal samples and groups them into a sequence of time-domain signal sample blocks. Each block comprises N signal samples. The signal samples may be received from the sampling of an analog signal, from the generation of samples representing or simulating an analog signal, or from any other source of discrete-valued samples which correspond to an analog signal.

It is well known in the art that the frequency-resolving power or selectivity of a filter bank implemented by a discrete transform improves as the transform length increases. It is also well known that filter selectivity may be affected significantly by weighting the time-domain signal samples by a weighting function commonly called a window. See generally, Harris, "On the Use of Windows for Harmonic Analysis with the Discrete Fourier Transform," *Proc. IEEE*, vol. 66, January, 1978, pp. 51-83.

The E-TDAC transform used in the basic embodiment of the present invention requires window weighting, both weighting of the time-domain signal samples in an encoder prior to forward transform filtering, referred to as analysis windowing, and weighting of the recovered time-domain signal samples in a decoder after inverse transform filtering, referred to as synthesis windowing. Analysis- and synthesis-window weighting are discussed below only briefly. It is assumed herein that the buffered signal samples are weighted by an analysis window as may be required or desired. Signal samples may be weighted by an analysis window prior to or subsequent to their receipt by the buffer without departing from the scope of the present invention.

B. Analysis Filter Bank—Forward Transform

Although the forward pretransform function discussed below is applied to time-domain signal sample blocks prior to application of the forward transform, it is necessary to introduce the forward transform before the forward pretransform function can be fully described. The forward transform is represented by box 108 in FIG. 1.

The E-TDAC transform used in the basic embodiment of the present invention is equivalent to the alternate application of a Modified Discrete Cosine Transform (MDCT) with a Modified Discrete Sine Transform (MDST). The MDCT and the MDST, shown in equations 1 and 2 respectively, are $$C(k) = \sum_{n=0}^{N-1} x(n)\cos\left(2\pi k \frac{n+m}{N}\right) \text{ for } 0 \leq k < N \quad (1)$$

$$S(k) = \sum_{n=0}^{N-1} x(n)\sin\left(2\pi k \frac{n+m}{N}\right) \text{ for } 0 \leq k < N \quad (2)$$

where
- k = frequency-domain transform coefficient number,
- n = time-domain signal sample number,
- N = time-domain signal sample block length,
- m = phase term required for TDAC (see equation 6),
- x(n) = time-domain signal sample n,
- C(k) = MDCT frequency-domain transform coefficient k, and
- S(k) = MDST frequency-domain transform coefficient k.

The E-TDAC transform produces one of two alternating sets of frequency-domain transform coefficients in response to each time-domain signal sample block. These sets of frequency-domain transform coefficients are of the form $$\{C(k)\}_i = \begin{bmatrix} C(k) & \text{for } 0 \leq k < \frac{N}{2} \\ 0 & \text{for } k = \frac{N}{2} \end{bmatrix} \quad (3)$$

$$\{S(k)\}_i = \begin{bmatrix} S(k) & \text{for } 0 < k \leq \frac{N}{2} \\ 0 & \text{for } k = 0 \end{bmatrix} \quad (4)$$

where i = time-domain signal sample block number. Each set of coefficients generated by the MDCT and the MDST are referred to herein as MDCT coefficient sets and MDST coefficient sets, respectively.

Princen and Bradley showed that with the proper phase term m and a suitable pair of analysis-synthesis windows, the E-TDAC technique can accurately recover an input signal from an alternating sequence of overlapped fixed-length MDCT coefficient sets and MDST coefficient sets of the form $$\{C(k)\}_0, \{S(k)\}_1, \{C(k)\}_2, \{S(k)\}_3, \quad (5)$$

Using only the alternate MDCT coefficient sets and MDST coefficient sets produces a time-domain aliasing component, but the aliasing component may be cancelled by choosing the appropriate phase term m for equations 1 and 2, applying the forward transform to overlapped analysis-window weighted time-domain signal sample blocks, and by synthesis-window weighting and adding adjacent overlapped time-domain signal sample blocks recovered by the inverse transform. The phase term m in equations 1 and 2 controls the phase shift of the time-domain aliasing distortion. To cancel this alias distortion and accurately recover the original time-domain signal, E-TDAC requires the aliasing to be as follows: for the MDCT, the time-domain alias component consists of the first half of the sampled and windowed signal reversed in time about the one-quarter point of the sample block, and the second half of the sampled and windowed signal reversed in time about the three-quarter point of the sample block; for the MDST, the alias component is similar to that for the MDCT except its amplitude is inverted in sign. These relationships are illustrated in FIG. 5 in which the time-domain aliasing component, shown by a broken line, and the desired signal, shown by a solid line, have been weighted by a synthesis window.

The phase term required to produce the appropriate aliasing components for alias cancellation $$m = \frac{\frac{N}{2}+1}{2} = \frac{N}{4} + \frac{1}{2}. \quad (6)$$

C. Forward Pre-Transform Function

The processing requirements of the technique used to evaluate the MDCT and the MDST may be reduced by applying a forward pretransform function to the time-domain signal sample blocks to produce blocks of modified samples, and applying a ½N-point DCT and a ½N-point DST to the modified sample blocks for the N-point MDCT and MDST, respectively. The forward pretransform function is represented by box 106 in FIG. 1. For E-TDAC, the pretransform function combines pairs of signal samples in each time-domain signal sample block of length N to produce a block of modified samples of length ½N.

The mathematical basis for using a ½N-point DCT applied to modified samples to perform the N-point MDCT may be seen by first substituting equation 6 for the phase term m into equation 1. The MDCT in equation 1 may be expressed as $$C(k) = \sum_{n=0}^{\frac{N}{4}-1} x(n)\cos\left(\frac{2\pi k}{N}\left[n + \frac{N}{4} + \frac{1}{2}\right]\right) + \quad (7a)$$

$$\sum_{n=\frac{N}{4}}^{\frac{N}{2}-1} x(n)\cos\left(\frac{2\pi k}{N}\left[n + \frac{N}{4} + \frac{1}{2}\right]\right) + \quad (7b)$$

$$\sum_{n=\frac{N}{2}}^{\frac{3N}{4}-1} x(n)\cos\left(\frac{2\pi k}{N}\left[n + \frac{N}{4} + \frac{1}{2}\right]\right) + \quad (7c)$$

$$\sum_{n=\frac{3N}{4}}^{N-1} x(n)\cos\left(\frac{2\pi k}{N}\left[n + \frac{N}{4} + \frac{1}{2}\right]\right) \quad (7d)$$

for $0 \leq k < N$.

By setting d=n+N/4 and substituting it into expression 7a, by setting d=3N/4−1−n and substituting it into expressions 7b and 7c, and by setting d=n−3N/4 and substituting it into expression 7d, it may be seen that equation 1 can be rewritten as $$C(k) = \sum_{d=0}^{\frac{N}{4}-1}\left\{x\left(\frac{3N}{4}+d\right)+ \right. \tag{8a}$$

$$\left. x\left(\frac{3N}{4}-1-d\right)\right\}\cos\left(\frac{2\pi k}{N}\left[d+\frac{1}{2}\right]\right)+$$

$$\sum_{d=\frac{N}{4}}^{\frac{N}{2}-1}\left\{x\left(d-\frac{N}{4}\right)+ \right. \tag{8b}$$

$$\left. x\left(\frac{3N}{4}-1-d\right)\right\}\cos\left(\frac{2\pi k}{N}\left[d+\frac{1}{2}\right]\right)$$

for $0 \leq k < N$.

Finally, by defining a new sequence $$y(n) = \frac{1}{2}\left\{x\left(\left[\frac{3N}{4}+n\right] \bmod N\right)+ \right. \tag{9}$$

$$\left. x\left(\left[\frac{3N}{4}-1-n\right] \bmod N\right)\right\} \text{ for } 0 \leq n < \frac{1}{2}N,$$

where [i] mod M represents the value of i modulo M, the expressions 8a and 8b may be combined and written as $$C(k) = \sum_{n=0}^{\frac{N}{2}-1} y(n)\cos\left(\frac{2\pi k}{N}\left[n+\frac{1}{2}\right]\right) \text{ for } 0 \leq k < N \tag{10}$$

which is a ½N-point DCT for y(n).

From a similar derivation, it can be shown that the MDST of length N can be implemented by a DST of length ½N, $$S(k) = \sum_{n=0}^{\frac{N}{2}-1} z(n)\sin\left(\frac{2\pi k}{N}\left[n+\frac{1}{2}\right]\right) \text{ for } 0 \leq k < N \tag{11}$$

where $$z(n) = \frac{1}{2}\left\{x\left(\left[\frac{3N}{4}+n\right] \bmod N\right)- \right. \tag{12}$$

$$\left. x\left(\left[\frac{3N}{4}-1-n\right] \bmod N\right)\right\} \text{ for } 0 \leq n < \frac{1}{2}N.$$

It should be appreciated that the forward pretransform function for this basic embodiment, as well as for alternative embodiments discussed below, can be performed by any of several implementations including software-controlled processors, and circuits capable of combining pairs of time-domain signal samples to form modified samples. One flowgraph for a 16-sample block is shown in FIG. 3 which illustrates the forward pretransform functions of equations 9 and 12 for a basic embodiment of the present invention. The minus signs shown within parenthesis denote terms which are subtractively combined with an associated sample for the function shown above in equation 12. This subtractive combination may be accomplished in circuitry, for example, by negating the value of the signal sample representations corresponding to the nodes in FIG. 3 with minus signs in parenthesis, and additively combining the resultant representations.

D. Forward Post-Transform Function

Frequency-domain transform coefficients generated by the forward transform are generally not suitable for low bit-rate transmission or efficient storage. Various quantization techniques may be used to reduce informational requirements by taking advantage of a signal's redundancy and irrelevancy.

In a basic embodiment of the present invention, the forward post-transform function represented by box 110 in FIG. 1 may comprise quantizing the frequency-domain transform coefficients, however, quantizing is not required to practice the present invention. Quantizing is frequently used in audio coding applications because it may reduce coded signal informational requirements without degrading subjective signal quality by exploiting psychoacoustic masking effects. For ease in discussing the basic embodiment of the present invention, it is assumed hereafter that the forward post-transform function includes quantizing the frequency-domain transform functions into quantized information.

Any of various quantizing techniques may be utilized without departing from the scope of the present invention. See generally, Jayant and Noll, *Digital Coding of Waveforms*, Englewood Cliffs, N.J.: Prentice-Hall, Inc., 1984, pp. 563–76. An example of one quantizing technique employing adaptive bit allocation is discussed in International Patent Application PCT/US 90/00501, Publication No. WO 90/09022 (published Aug. 9, 1990).

E. Output Formatting

Output formatting represented by box 112 in FIG. 1 assembles a coded digital signal, including quantized information, for transmission or storage. Any additional side-information needed by a decoder is also assembled into the formatted signal. Frame synchronization bits and error detection/correction codes may be used as needed for transmission. Database pointers or keys may be added as needed for storage. The formatted data is ready for transmission or for storage along path 114 shown in FIG. 1.

F. Input Deformatting

A deformatting process takes place in a decoder when the encoded signal is received from path 200 either by receipt of a transmitted signal or retrieval from storage. The deformatting process is represented by box 202 in FIG. 2. Deformatting extracts quantized information and any side information passed by the encoder.

G. Inverse Pre-Transform Function

The inverse pretransform function, represented by box 206 in FIG. 2, obtains frequency-domain transform coefficients by performing a function essentially inverse to that used by the forward post-transform function in the encoder which encoded the signal.

In a basic embodiment of the present invention, the inverse pretransform recovers spectral information by dequantizing the encoded digital information into a form suitable for input to the inverse transform filter bank.

H. Synthesis Filter Bank—Inverse Transform

Box 208 in FIG. 2 represents a bank of synthesis filters which transforms each set of frequency-domain transform coefficients into time-domain transform coefficients. A transform inverse to that used in analysis filter bank 108 in FIG. 1 implements synthesis filter bank 208. The inverse discrete transforms for E-TDAC used in the basic embodiment of the present invention is an alternating application of an Inverse Modified Discrete Cosine Transform (IMDCT) and an Inverse Modified Discrete Sine Transform (IMDST) shown in equations 13 and 14, respectively;

$$\hat{x}(n) = \frac{1}{N} \sum_{k=0}^{N-1} \hat{C}(k)\cos\left(2\pi k \frac{n+m}{N}\right) \text{ for } 0 \leq n < N \quad (13)$$

$$\hat{x}(n) = \frac{1}{N} \sum_{k=0}^{N-1} \hat{S}(k)\sin\left(2\pi k \frac{n+m}{N}\right) \text{ for } 0 \leq n < N \quad (14)$$

where
$\hat{C}(k)$ = recovered MDCT frequency-domain transform coefficient k,
$\hat{S}(k)$ = recovered MDST frequency-domain transform coefficient k, and
$\hat{x}(n)$ = recovered time-domain signal sample n.

I. Inverse Post-Transform Function

The processing requirements of the technique used to evaluate the IMDCT and the IMDST may be reduced by instead evaluating an Inverse DCT (IDCT) and an Inverse DST (IDST) and applying an inverse post-transform function after application of the inverse transforms. This inverse post-transform function is represented by box 210 in FIG. 2.

For E-TDAC, the inverse post-transform function splits time-domain transform coefficients into signal samples. Using a derivation similar to that discussed above for the forward transform, it can be shown that, with an appropriate inverse post-transform function, discussed below, the IMDCT of length N can be implemented by an IDCT of length $\frac{1}{2}$N;

$$\hat{y}(n) = \quad (15)$$

$$\frac{2}{N} \sum_{k=0}^{\frac{N}{2}-1} \alpha(k)\hat{C}(k)\cos\left(\frac{2\pi k}{N}\left[n + \frac{1}{2}\right]\right) \text{ for } 0 \leq n < \frac{1}{2}N$$

where
$\hat{y}(n)$ = recovered time-domain transform coefficient n, and $$\alpha(k) = \begin{bmatrix} 1 & \text{for } k = 0, \frac{N}{2} \\ 2 & \text{otherwise.} \end{bmatrix}$$

Each recovered time-domain signal sample $\hat{x}(n)$ may be obtained from the time-domain transform coefficients $\hat{y}(n)$ according to $$\hat{x}(n) = \quad (16)$$

$$\hat{y}\left(\left[n - \frac{3N}{4}\right] \mod N\right) \text{ for } 0 \leq n < \frac{1}{4}N, \frac{3}{4}N \leq n < N,$$

$$\hat{x}(n) = \quad (17)$$

$$\hat{y}\left(\left[\frac{3N}{4} - 1 - n\right] \mod N\right) \text{ for } \frac{1}{4}N \leq n < \frac{3}{4}N.$$

With an appropriate inverse post-transform function, the IMDST of length N can be implemented by an IDST of length $\frac{1}{2}$N;

$$\hat{z}(n) = \quad (18)$$

$$\frac{2}{N} \sum_{k=1}^{\frac{N}{2}} \alpha(k)\hat{S}(k)\sin\left(\frac{2\pi k}{N}\left[n + \frac{1}{2}\right]\right) \text{ for } 0 \leq n < \frac{1}{2}N$$

where $\hat{z}(n)$ = recovered time-domain transform coefficient n.

Each recovered time-domain signal sample may be obtained from the time-domain transform coefficients $\hat{z}(n)$ according to $$\hat{x}(n) = \quad (19)$$

$$\hat{z}\left(\left[n - \frac{3N}{4}\right] \mod N\right) \text{ for } 0 \leq n < \frac{1}{4}N, \frac{3}{4}N \leq n < N,$$

$$\hat{x}(n) = -\hat{z}\left(\left[\frac{3N}{4} - 1 - n\right] \mod N\right) \text{ for } \frac{1}{4}N \leq n < \frac{3}{4}N. \quad (20)$$

J. Output Sample Processing

An overlap-add process is required to generate samples corresponding to signal samples encoded by a companion encoder. This process, represented by box 212 in FIG. 2, overlaps adjacent time-domain sample blocks recovered from the inverse transform and adds the samples in one block to samples in the adjacent overlapped block.

The E-TDAC transform used in the basic embodiment of the present invention requires, in addition to overlap-add, the application of a synthesis window to the time-domain sample blocks. The constraints the E-TDAC transform places upon the design of the synthesis window, the analysis window, and the overlap-add process is discussed fully in the paper by Princen and Bradley referred to above.

III. Alternative Fixed-Length Embodiments

Alternative embodiments of the present invention may achieve greater reductions in processing requirements. The following description discusses the differences between these alternative embodiments and the basic embodiment described above.

A. E-TDAC Implemented by DFT

In one alternative embodiment of the present invention for an encoder, the forward E-TDAC transform is implemented by a Discrete Fourier Transform (DFT).

A forward pretransform function generates an alternating sequence of two types of blocks comprising modified samples; one block type comprising modified samples p(n), and a second block type comprising modified samples r(n). Each modified sample is formed from the combination of one pair of signal samples x(n) according to $$p(n) = \frac{1}{2}\left\{ x\left(\left[\frac{3N}{4} + 2n\right] \bmod N \right) + \right. \tag{21}$$

$$\left. x\left(\left[\frac{3N}{4} - 1 - 2n\right] \bmod N \right) \right\} \text{for } 0 \leq n < \frac{1}{2} N,$$

$$r(n) = \frac{1}{2}\left\{ x\left(\left[\frac{3N}{4} + 2n\right] \bmod N \right) - \right. \tag{22}$$

$$\left. x\left(\left[\frac{3N}{4} - 1 - 2n\right] \bmod N \right) \right\} \text{for } 0 \leq n < \frac{1}{2} N.$$

A flowgraph for a 16-sample block illustrating this forward pretransform function is shown in FIG. 4.

The forward E-TDAC transform is implemented by a DFT which generates alternating sets of complex-valued frequency-domain transform coefficients, P(k) of the form T(k)+j·U(k) and R(k) of the form V(k)+j·W(k), in response to the alternating sequence of modified sample blocks;

$$P(k) = \sum_{n=0}^{\frac{N}{2}-1} p(n)e^{-j2\pi k \frac{2n}{N}} \text{ for } 0 \leq k \leq \frac{1}{2} N, \tag{23}$$

$$R(k) = \sum_{n=0}^{\frac{N}{2}-1} r(n)e^{-j2\pi k \frac{2n}{N}} \text{ for } 0 \leq k \leq \frac{1}{2} N \tag{24}$$

where $j = \sqrt{-1}$.

Spectral information corresponding to E-TDAC transform coefficients C(k) and S(k) is obtained by applying a forward post-transform function according to;

$$C(k) = \cos\left(\frac{\pi k}{N}\right) \cdot T(k) + \sin\left(\frac{\pi k}{N}\right) \cdot U(k), \tag{25}$$

$$S(k) = \sin\left(\frac{\pi k}{N}\right) \cdot V(k) - \cos\left(\frac{\pi k}{N}\right) \cdot W(k). \tag{26}$$

In one alternative embodiment of the present invention for a decoder, the inverse E-TDAC transform is implemented by an Inverse DFT (IDFT).

An inverse pretransform function recovers spectral information $\hat{C}(k)$ and $\hat{S}(k)$, corresponding to E-TDAC transform coefficients C(k) and S(k), respectively, from the encoded signal, and generates in response to the recovered spectral information an alternating sequence of two types of blocks comprising recovered frequency-domain transform coefficients; one block type comprising recovered complex-valued coefficients $\hat{P}(k)$ of the form $\hat{T}(k)+j\cdot\hat{U}(k)$, and a second block type comprising recovered complex-valued coefficients $\hat{R}(k)$ of the form $\hat{V}(k)+j\cdot\hat{W}(k)$. Each frequency-domain transform coefficient is obtained according to $$\hat{T}(k) = \cos\left(\frac{\pi k}{N}\right) \cdot \hat{C}(k) + \sin\left(\frac{\pi k}{N}\right) \cdot \hat{C}\left(\frac{N}{2} - k\right), \tag{27}$$

$$\hat{U}(k) = \sin\left(\frac{\pi k}{N}\right) \cdot \hat{C}(k) - \cos\left(\frac{\pi k}{N}\right) \cdot \hat{C}\left(\frac{N}{2} - k\right), \tag{28}$$

$$\hat{V}(k) = \cos\left(\frac{\pi k}{N}\right) \cdot \hat{S}\left(\frac{N}{2} - k\right) + \sin\left(\frac{\pi k}{N}\right) \cdot \hat{S}(k), \tag{29}$$

$$\hat{W}(k) = \sin\left(\frac{\pi k}{N}\right) \cdot \hat{S}\left(\frac{N}{2} - k\right) - \cos\left(\frac{\pi k}{N}\right) \cdot \hat{S}(k). \tag{30}$$

An inverse transform generates an alternating sequence of two types of blocks comprising recovered time-domain transform coefficients by applying an IDFT to the alternating sequence of frequency-domain transform coefficient blocks; one block type comprising recovered time-domain transform coefficients $\hat{p}(k)$, and a second block type comprising recovered time-domain transform coefficients $\hat{r}(k)$. The IDFT used to recover the time-domain transform coefficients is shown in equations 31 and 32;

$$\hat{p}(n) = \frac{2}{N} \sum_{k=0}^{\frac{N}{2}-1} \hat{P}(k)e^{j2\pi k \frac{2n}{N}} \text{ for } 0 \leq n < \frac{1}{2} N, \tag{31}$$

$$\hat{r}(n) = \frac{2}{N} \sum_{k=0}^{\frac{N}{2}-1} \hat{R}(k)e^{j2\pi k \frac{2n}{N}} \text{ for } 0 \leq n < \frac{1}{2} N. \tag{32}$$

Time-domain signal samples $\hat{x}(n)$ are recovered by applying an inverse post-transform function to each recovered coefficient from the alternating sequence of blocks comprising recovered time-domain transform coefficients. Signal samples are recovered from blocks comprising the $\hat{p}(k)$ coefficients according to $$\hat{x}(n) = \hat{p}\left(\left[\frac{n - \frac{3N}{4}}{2}\right] \bmod \left[\frac{N}{2}\right]\right) = \tag{33}$$

$$\hat{p}\left(\left[\frac{4n - 3N}{8}\right] \bmod \left[\frac{N}{2}\right]\right) \text{for } 0 \leq n < N, n \text{ even,}$$

$$\hat{x}(n) = \hat{p}\left(\left[\frac{\frac{3N}{4} - 1 - n}{2}\right] \bmod \left[\frac{N}{2}\right]\right) = \tag{34}$$

$$\hat{p}\left(\left[\frac{3N - 4 - 4n}{8}\right] \bmod \left[\frac{N}{2}\right]\right) \text{for } 0 \leq n < N, n \text{ odd.}$$

Signal samples are recovered from blocks comprising the $\hat{r}(k)$ coefficients according to $$\hat{x}(n) = \hat{r}\left(\left[\frac{n - \frac{3N}{4}}{2}\right] \bmod \left[\frac{N}{2}\right]\right) = \tag{35}$$

-continued $$\hat{r}\left(\left[\frac{4n - 3N}{8}\right] \bmod \left[\frac{N}{2}\right]\right) \text{for } 0 \leq n < N, n \text{ even},$$

$$\hat{x}(n) = -\hat{r}\left(\left[\frac{\frac{3N}{4} - 1 - n}{2}\right] \bmod \left[\frac{N}{2}\right]\right) = \tag{36}$$

$$-\hat{r}\left(\left[\frac{3N - 4 - 4n}{8}\right] \bmod \left[\frac{N}{2}\right]\right) \text{for } 0 \leq n < N, n \text{ odd}.$$

B. E-TDAC Implemented by Concurrent DFT

In another embodiment of the present invention for an encoder, the MDCT and the MDST of one or more forward E-TDAC transforms are implemented concurrently by one or more DFTS. In single channel encoder applications, two adjacent frequency-domain coefficient sets as illustrated in expression 5 above may be generated concurrently by a single DFT. In two channel applications, a MDCT coefficient set for channel one may be generated concurrently with a MDST coefficient set for channel two, immediately followed by a MDST coefficient set for channel one generated concurrently with a MDCT coefficient set for channel two. Other combinations of coefficient sets for concurrent processing are possible. For additional detail on concurrent transforms, see generally, Brigham, *The Fast Fourier Transform*, Englewood Cliffs, N.J.: Prentice-Hall, Inc., 1974, pp. 166–67.

A forward pretransform function generates a sequence of blocks comprising complex-valued modified samples $q(n)$ of the form $p(n)+j \cdot r(n)$ where $p(n)$ and $r(n)$ are formed from the application of the forward pretransform function described above and shown in equations 21 and 22.

The MDCT and the MDST constituting the forward E-TDAC transform are concurrently implemented by a DFT which generates complex-valued frequency-domain transform coefficients $Q(k)$ of the form $G(k)+j \cdot H(k)$ according to $$Q(k) = \sum_{n=0}^{\frac{N}{2}-1} q(n)e^{-j2\pi k \frac{2n}{N}} \text{ for } 0 \leq k \leq \frac{1}{2} N. \tag{37}$$

Spectral information corresponding to E-TDAC transform coefficients $C(k)$ and $S(k)$ is obtained by applying the forward post-transform functions according to $$C(k) = \frac{1}{2}\left\{\cos\left(\frac{\pi k}{N}\right) \cdot \left[G(k) + G\left(\frac{N}{2} - k\right)\right] + \tag{38}$$

$$\sin\left(\frac{\pi k}{N}\right) \cdot \left[H(k) - H\left(\frac{N}{2} - k\right)\right]\right\},$$

$$S(k) = \frac{1}{2}\left\{\cos\left(\frac{\pi k}{N}\right) \cdot \left[G(k) - G\left(\frac{N}{2} - k\right)\right] + \tag{39}$$

$$\sin\left(\frac{\pi k}{N}\right) \cdot \left[H(k) + H\left(\frac{N}{2} - k\right)\right]\right\}.$$

In another embodiment of the present invention for a decoder, the IMDCT and the IMDST of one or more inverse E-TDAC transforms are implemented concurrently by one or more IDFTS.

An inverse pretransform function recovers spectral information $\hat{C}(k)$ and $\hat{S}(k)$, corresponding to E-TDAC transform coefficients $C(k)$ and $S(k)$, respectively, from the encoded signal, and generates in response to the recovered spectral information a sequence of blocks comprising recovered complex-valued frequency-domain transform coefficients $\hat{Q}(k)$ of the form $\hat{G}(k)+j \cdot \hat{H}(k)$ where $\hat{G}(k)$ and $\hat{H}(k)$ are obtained from recovered spectral information according to $$\hat{G}(k) = \cos\left(\frac{\pi k}{N}\right) \cdot [\hat{C}(k) + \hat{S}(k)] + \tag{40}$$

$$\sin\left(\frac{\pi k}{N}\right) \cdot \left[\hat{C}\left(\frac{N}{2} - k\right) - \hat{S}\left(\frac{N}{2} - k\right)\right],$$

$$\hat{H}(k) = \sin\left(\frac{\pi k}{N}\right) \cdot [\hat{C}(k) + \hat{S}(k)] - \tag{41}$$

$$\cos\left(\frac{\pi k}{N}\right) \cdot \left[\hat{C}\left(\frac{N}{2} - k\right) - \hat{S}\left(\frac{N}{2} - k\right)\right].$$

The IMDCT and the IMDST constituting the inverse E-TDAC transform are concurrently implemented by an IDFT which generates complex-valued time-domain transform coefficients $\hat{q}(n)$ of the form $\hat{p}(n)+j \cdot \hat{r}(n)$ according to $$\hat{q}(n) = \frac{2}{N} \sum_{k=0}^{\frac{N}{2}-1} \hat{Q}(k)e^{j2\pi k \frac{2n}{N}} \text{ for } 0 \leq n < \frac{1}{2} N. \tag{42}$$

Time-domain signal samples $\hat{x}(n)$ are recovered from the application of the inverse post-transform function described above and shown in equations 33 through 36.

IV. Adaptive-Length Embodiments

A. Bridge Transform

As mentioned above, it is desirable that the technique which improves transform processing efficiency should also permit adaptive selection of the transform length. Although the means and considerations required to implement an adaptive-transform-length coder is not included within the scope of the present invention, it is noted that a more detailed discussion of adaptive-length transform coding is set forth in copending U.S. patent application Ser. No. 07/508,809, filed Apr. 12, 1990, which is hereby incorporated by reference.

Changes in the length of either the E-TDAC transform or the O-TDAC transform may require changes in the phase term m in order to realize time-domain aliasing cancellation. FIG. 5 is a hypothetical graphical representation of two adjacent overlapped N-sample length time-domain signal sample blocks recovered by an inverse E-TDAC transform, one block recovered from the IMDCT and the second block recovered from the IMDST after synthesis windowing but before overlap-add of the adjacent blocks has cancelled time-domain aliasing. The representation in this and other figures does not show individual signal samples, but rather illustrates only the envelope of windowed signal sample blocks.

Each recovered signal sample block comprises two components: one component represented by a solid line substantially corresponds to the analysis- and synthesis-windowed input signal samples, and the second component represented by a broken line is the time-domain aliasing distortion. As discussed above, the aliasing component is a time-reversed replica of the windowed input signal samples which occurs in two separate regions. The phase term m for the E-TDAC and the O-TDAC transforms controls the location of the boundary between these two regions. For fixed-length E-TDAC and O-TDAC transforms, the boundary is located at the mid-point of the signal sample block. The phase term required for time-domain aliasing cancellation under this condition is shown in equation 6.

FIG. 6 is a hypothetical graphical representation of three time-domain signal sample blocks recovered from an inverse E-TDAC transform prior to overlap-add. The first block is an N-sample length block which has been recovered from the IMDCT. The second and third blocks are ½N-sample length blocks which have been recovered from the IMDST. The aliasing component in the N-sample length MDCT block comprises a replica of the first half of the signal sample block reversed in time about the one-quarter point of the sample block, and a replica of the second half of the sampled signal reversed in time about the three-quarter point of the sample block. If overlap-add of the MDCT block and the first MDST sample block shown in FIG. 6 is to cancel time-domain aliasing, the time-domain aliasing component in the first MDST ½N-sample length block must be a replica of the entire block inverted in sign and time-reversed end-for-end. The phase term m required by the MDST and IMDST transforms to produce a time-domain aliasing component with these characteristics is m=½.

It can be shown that the phase term may be written generally as $$m = \frac{\phi + 1}{2} \quad (43)$$

where $\phi$ is the location of the boundary between time-reversal regions, expressed as the number of time-domain signal samples from the right-hand or trailing edge of the time-domain signal sample block.

For example, FIG. 7 illustrates two window-weighted time-domain signal sample blocks. The right-hand block is ¼N samples in length. Within this block, the boundary between time-reversal regions is at a point N/8 samples from the right-hand or trailing edge of the block. Thus, the phase term m required to cause time-reversal of the aliasing component within each region of the ¼N-sample block is $$m = \frac{\frac{N}{8} + 1}{2}.$$

With this background established, it is now possible to introduce the "bridge transform." A bridge transform is a transform which bridges the shift from one transform length to another. For example, as shown in FIG. 8, suppose the present invention is called upon to process one block of ½N samples followed by another block of ¼N samples. It is possible to perform a separate transform for each block. For reasons whose explanation exceed the scope of this discussion, a bridge transform improves coder performance by instead transforming a single block of ⅜N samples.

The bridge transform required to process the ⅜N-sample block shown in FIG. 8 may be implemented by an FFT to compute the transform for three ⅛N blocks followed by a recombination operation. This technique is known in the art and is discussed in Oppenheim and Schafer, *Digital Signal Processing*, Englewood Cliffs, N.J.: Prentice-Hall, Inc., 1975, pp. 307-14. The FFT with this recombination operation can also be used to concurrently process two E-TDAC bridge transforms in the same manner as that briefly discussed above for fixed-length transforms. It is important to note, however, that concurrent processing in E-TDAC is possible only for a MDCT and MDST which have the same length.

For the decoder, the length of the inverse transform may be established by side-information passed by the encoder in the encoded signal. The same considerations for adaptive-length transforms and bridge transforms that were discussed above for the forward transform, including the phase term required for time-domain aliasing cancellation, also apply to the inverse transform.

The following describes differences between adaptive-length embodiments of the present invention and the fixed-length embodiments discussed above. The structure of each adaptive-length embodiment is substantially the same as that for a corresponding fixed-length embodiment. The most significant differences pertain to the pre- and post-transform functions, and to the length and phase terms of the transform functions. In the following discussions, each time-domain signal sample block is defined to be a+b samples in length, overlapping the immediately prior block by a samples, and overlapping the immediately subsequent block by b samples. It is assumed that the number of samples in the two overlap intervals may vary from block to block. According to the conventions established in the previous discussion, the bridge transform applied to each time-domain signal sample block is an adaptive-length (a+b)-point transform.

B. E-TDAC Implemented by DCT/DST

One adaptive-length embodiment corresponds to the fixed-length basic embodiment discussed above. The forward pretransform, corresponding to the functions shown in equations 9 and 12 of the fixed-length embodiment, generates an alternating sequence of modified sample blocks according to $$y(n) = \frac{1}{2}\left( x\left(\left[\frac{2a+b}{2} + n\right] \mod[a+b]\right) + \right. \quad (44)$$

$$\left. x\left(\left[\frac{2a+b}{2} - 1 - n\right] \mod[a+b]\right)\right) \text{for } 0 \le n < \frac{a+b}{2},$$

$$z(n) = \frac{1}{2}\left( x\left(\left[\frac{2a+b}{2} + n\right] \mod[a+b]\right) - \right. \quad (45)$$

$$\left. x\left(\left[\frac{2a+b}{2} - 1 - n\right] \mod[a+b]\right)\right) \text{for } 0 \le n < \frac{a+b}{2}.$$

A flowgraph illustrating this forward pretransform function, for a 16-sample block with a=4 and b=12, is shown in FIG. 9.

The forward transform comprises a DCT and a DST according to $$C(k) = \sum_{n=0}^{\frac{a+b}{2}-1} y(n)\cos\left(\frac{2\pi k}{a+b}\left[n+\frac{1}{2}\right]\right) \quad (46)$$

for $0 \leq k < a + b$, $$S(k) = \sum_{n=0}^{\frac{a+b}{2}-1} z(n)\sin\left(\frac{2\pi k}{a+b}\left[n+\frac{1}{2}\right]\right) \quad (47)$$

for $0 \leq k < a + b$.

The inverse transform comprises an IDCT and an IDST according to $$\hat{y}(n) = \frac{2}{a+b} \sum_{k=0}^{\frac{a+b}{2}-1} \alpha(k)\hat{C}(k)\cos\left(\frac{2\pi k}{a+b}\left[n+\frac{1}{2}\right]\right) \quad (48)$$

for $0 \leq n < \frac{a+b}{2}$, $$\hat{z}(n) = \frac{2}{a+b} \sum_{k=1}^{\frac{a+b}{2}} \alpha(k)\hat{S}(k)\sin\left(\frac{2\pi k}{a+b}\left[n+\frac{1}{2}\right]\right) \quad (49)$$

for $0 \leq n < \frac{a+b}{2}$.

The inverse post-transform function, corresponding to the functions shown in equations 16, 17, 19, and 20 for the fixed-length embodiment, recovers time-domain signal samples from time-domain transform coefficients according to $$\hat{x}(n) = \hat{y}\left(\left[n - \frac{2a+b}{2}\right]\mod[a+b]\right) \quad (50)$$

for $0 \leq n < \frac{a}{2}, \frac{2a+b}{2} \leq n < a+b$, $$\hat{x}(n) = \hat{y}\left(\left[\frac{2a+b}{2} - 1 - n\right]\mod[a+b]\right) \quad (51)$$

for $\frac{a}{2} \leq n < \frac{2a+b}{2}$, $$\hat{x}(n) = \hat{z}\left(\left[n - \frac{2a+b}{2}\right]\mod[a+b]\right) \quad (52)$$

for $0 \leq n < \frac{a}{2}, \frac{2a+b}{2} \leq n < a+b$, $$\hat{x}(n) = -\hat{z}\left(\left[\frac{2a+b}{2} - 1 - n\right]\mod[a+b]\right) \quad (53)$$

for $\frac{a}{2} \leq n < \frac{2a+b}{2}$.

C. E-TDAC Implemented by DFT

Another adaptive-length embodiment corresponds to the fixed-length embodiment of the E-TDAC transform implemented by a DFT, discussed above. The forward pretransform, corresponding to the functions shown in equations 21 and 22 for the fixed-length embodiment, generates an alternating sequence of modified sample blocks according to $$p(n) = \frac{1}{2}\left\{x\left(\left[\frac{2a+b}{2} + 2n\right]\mod[a+b]\right) + \right. \quad (54)$$

$$\left. x\left(\left[\frac{2a+b}{2} - 1 - 2n\right]\mod[a+b]\right)\right\} \text{for } 0 \leq n < \frac{a+b}{2},$$

$$r(n) = \frac{1}{2}\left\{x\left(\left[\frac{2a+b}{2} + 2n\right]\mod[a+b]\right) - \right. \quad (55)$$

$$\left. x\left(\left[\frac{2a+b}{2} - 1 - 2n\right]\mod[a+b]\right)\right\} \text{for } 0 \leq n < \frac{a+b}{2}.$$

The forward E-TDAC transform is implemented by a DFT which generates alternating sets of complex-valued frequency-domain transform coefficients, P(k) of the form T(k)+j·U(k) and R(k) of the form V(k)+j·W(k), in response to the alternating sequence of modified sample blocks according to $$P(k) = \sum_{n=0}^{\frac{a+b}{2}-1} p(n)e^{-j2\pi k \frac{2n}{a+b}} \text{ for } 0 \leq k \leq \frac{a+b}{2}, \quad (56)$$

$$R(k) = \sum_{n=0}^{\frac{a+b}{2}-1} r(n)e^{-j2\pi k \frac{2n}{a+b}} \text{ for } 0 \leq k \leq \frac{a+b}{2}. \quad (57)$$

The forward post-transform, corresponding to the functions shown in equations 25 and 26 for the fixed-length embodiment, generates alternating sets of spectral information according to $$C(k) = \cos\left(\frac{\pi k}{a+b}\right) \cdot T(k) + \sin\left(\frac{\pi k}{a+b}\right) \cdot U(k), \quad (58)$$

$$S(k) = \sin\left(\frac{\pi k}{a+b}\right) \cdot V(k) - \cos\left(\frac{\pi k}{a+b}\right) \cdot W(k). \quad (59)$$

The inverse pretransform function, corresponding to the functions shown in equations 27 through 30 for the fixed-length embodiment, generates an alternating sequence of blocks comprising recovered frequency-domain transform coefficients; one block type comprising recovered complex-valued coefficients $\hat{P}(k)$ of the form $\hat{T}(k)+j\cdot\hat{U}(k)$, and a second block type comprising recovered complex-valued coefficients $\hat{R}(k)$ of the form $\hat{V}(k)+j\cdot\hat{W}(k)$. Each frequency-domain transform coefficient is obtained according to $$\hat{T}(k) = \quad (60)$$

$$\cos\left(\frac{\pi k}{a+b}\right) \cdot \hat{C}(k) + \sin\left(\frac{\pi k}{a+b}\right) \cdot \hat{C}\left(\frac{a+b}{2} - k\right),$$

$$\hat{U}(k) = \quad (61)$$

$$\sin\left(\frac{\pi k}{a+b}\right) \cdot \hat{C}(k) - \cos\left(\frac{\pi k}{a+b}\right) \cdot \hat{C}\left(\frac{a+b}{2} - k\right),$$

$$\hat{V}(k) = \quad (62)$$

$$\hat{W}(k) = \begin{array}{c} \cos\left(\frac{\pi k}{a+b}\right) \cdot \hat{S}\left(\frac{a+b}{2} - k\right) + \sin\left(\frac{\pi k}{a+b}\right) \cdot \hat{S}(k), \\ \\ \sin\left(\frac{\pi k}{a+b}\right) \cdot \hat{S}\left(\frac{a+b}{2} - k\right) - \cos\left(\frac{\pi k}{a+b}\right) \cdot \hat{S}(k). \end{array} \quad (63)$$

The inverse transform generates an alternating sequence of two types of blocks comprising recovered time-domain transform coefficients by applying an IDFT to the alternating sequence of frequency-domain transform coefficient blocks; one block type comprising recovered time-domain transform coefficients $\hat{p}(k)$, and a second block type comprising recovered time-domain transform coefficients $\hat{r}(k)$. The IDFT used to recover the time-domain transform coefficients is shown in equations 64 and 65;

$$\hat{p}(n) = \frac{2}{a+b} \sum_{k=0}^{\frac{a+b}{2}-1} \hat{P}(k) e^{j2\pi k \frac{2n}{a+b}} \text{ for } 0 \le n < \frac{a+b}{2}, \quad (64)$$

$$\hat{r}(n) = \frac{2}{a+b} \sum_{k=0}^{\frac{a+b}{2}-1} \hat{R}(k) e^{j2\pi k \frac{2n}{a+b}} \text{ for } 0 \le n < \frac{a+b}{2}. \quad (65)$$

The inverse post-transform function, corresponding to the functions shown in equations 33 through 36 for the fixed-length embodiment, recovers time-domain signal samples from time-domain transform coefficients according to $$\hat{x}(n) = \hat{p}\left(\left[\frac{n - \frac{2a+b}{2}}{2}\right] \mod \left[\frac{a+b}{2}\right]\right) = \quad (66)$$

$$\hat{p}\left(\left[\frac{2n - 2a - b}{4}\right] \mod \left[\frac{a+b}{2}\right]\right) \text{ for } n \text{ even,}$$

$$\hat{x}(n) = \hat{p}\left(\left[\frac{\frac{2a+b}{2} - 1 - n}{2}\right] \mod \left[\frac{a+b}{2}\right]\right) = \quad (67)$$

$$\hat{p}\left(\left[\frac{2a + b - 2 - 2n}{4}\right] \mod \left[\frac{a+b}{2}\right]\right) \text{ for } n \text{ odd,}$$

$$\hat{x}(n) = \hat{r}\left(\left[\frac{n - \frac{2a+b}{2}}{2}\right] \mod \left[\frac{a+b}{2}\right]\right) = \quad (68)$$

$$\hat{r}\left(\left[\frac{2n - 2a - b}{4}\right] \mod \left[\frac{a+b}{2}\right]\right) \text{ for } n \text{ even,}$$

$$\hat{x}(n) = -\hat{r}\left(\left[\frac{\frac{2a+b}{2} - 1 - n}{2}\right] \mod \left[\frac{a+b}{2}\right]\right) = \quad (69)$$

$$-\hat{r}\left(\left[\frac{2a + b - 2 - 2n}{4}\right] \mod \left[\frac{a+b}{2}\right]\right) \text{ for } n \text{ odd,}$$

where $0 \le n < a+b$.

D. O-TDAC Implemented by DST

The O-TDAC transform utilizes a MDCT of the form $$E(k) = \sum_{n=0}^{a+b-1} x(n) \cos\left(2\pi \left[k + \frac{1}{2}\right] \frac{n+m}{a+b}\right) \quad (70)$$

for $0 \le k < a+b$ where $E(k)$ = frequency-domain transform coefficient k.

The processing requirements needed to implement this transform can be reduced by applying a forward pretransform function to the time-domain signal samples to generate modified samples e(n), then applying a DST to the modified samples to generate frequency-domain transform coefficients X(k). The forward pretransform function is $$e(n) = x\left(\left[\frac{a}{2} + n\right] \mod [a + b]\right) - \quad (71)$$

$$x\left(\left[\frac{a}{2} - 1 - n\right] \mod [a + b]\right) \text{ for } 0 \le n < \frac{a}{2},$$

$$e(n) = x\left(\left[\frac{a}{2} + n\right] \mod [a + b]\right) + \quad (72)$$

$$x\left(\left[\frac{a}{2} - 1 - n\right] \mod [a + b]\right) \text{ for } \frac{a}{2} \le n < \frac{a+b}{2}.$$

A flowgraph illustrating this forward pretransform function, for a 16-sample block with a=4 and b=12, is shown in FIG. 10. The minus signs denote terms which are subtractively combined with an associated sample for the function shown above in equation 71.

The forward transform comprises a DST according to $$E(k) = \sum_{n=0}^{\frac{a+b}{2}-1} e(n) \sin\left(\frac{2\pi}{a+b}\left[k + \frac{1}{2}\right]\left[n + \frac{1}{2}\right]\right) \quad (73)$$

for $0 \le k < a+b$.

The inverse transform comprises an IDST according to $$\hat{e}(n) = \quad (74)$$

$$\frac{4}{a+b} \sum_{k=0}^{\frac{a+b}{2}-1} \hat{E}(k) \sin\left(\frac{2\pi}{a+b}\left[k + \frac{1}{2}\right]\left[n + \frac{1}{2}\right]\right)$$

for $0 \le n < a+b$ where
 $\hat{e}(k)$ = recovered time-domain transform coefficient, and
 $\hat{E}(k)$ = recovered frequency-domain transform coefficient k.

The inverse post-transform function recovers time-domain signal samples x(n) from time-domain transform coefficients according to $$\hat{x}(n) = -\hat{e}\left(\left[\frac{a}{2} - 1 - n\right] \mod[a + b]\right) \text{ for } 0 \leq n < \frac{a}{2}, \quad (75)$$

$$\hat{x}(n) = \quad (76)$$

$$\hat{e}\left(\left[n - \frac{a}{2}\right] \mod[a + b]\right) \text{ for } \frac{a}{2} \leq n < \frac{2a + b}{2},$$

$$\hat{x}(n) = \quad (77)$$

$$\hat{e}\left(\left[\frac{a}{2} - 1 - n\right] \mod[a + b]\right) \text{ for } \frac{2a + b}{2} \leq n < a + b.$$

We claim:

1. In an encoder a combination for the filtering of one or more signals comprising input samples, said combination comprising means for receiving said input samples representing stimuli intended for human perception, input buffer means for grouping said input samples into time-domain signal sample blocks of length N, where N is a positive integer, wherein said input samples are analysis-window weighted samples, analysis means for generating spectral information in response to said time-domain signal sample blocks, said spectral information comprising spectral coefficients C(k) and S(k) substantially corresponding to the frequency-domain transform coefficients of an Evenly-Stacked Time-Domain Aliasing Cancellation transform applied to said time-domain signal sample blocks, wherein said spectral coefficients C(k) and S(k) substantially correspond to Modified Discrete Cosine Transform coefficients and Modified Discrete Sine Transform coefficients, respectively, comprising forward pre-transform means for generating modified-sample blocks comprising ½N modified samples by combining one or more pairs of analysis-window weighted samples to form said modified samples, and forward transform means for generating frequency-domain transform coefficients by applying one or more discrete transform functions to said modified-sample blocks, and means for generating an encoded signal in response to said spectral information.

2. The combination according to claim 1 wherein said forward pretransform means generates first modified-sample blocks comprising modified samples y(n) formed from the additive combination of a pair of analysis-window weighted samples x(n) from a respective one of said time-domain signal sample blocks according to $$y(n) = \frac{1}{2}\left\{x\left(\left[\frac{3N}{4} + n\right] \mod N\right) + x\left(\left[\frac{3N}{4} - 1 - n\right] \mod N\right)\right\} \text{ for } 0 \leq n < \frac{N}{2},$$

and said forward pretransform means generates second modified-sample blocks comprising modified samples z(n) formed from the subtractive combination of a pair of analysis-window weighted samples x(n) from another respective one of said time-domain signal sample blocks according to $$z(n) = \frac{1}{2}\left\{x\left(\left[\frac{3N}{4} + n\right] \mod N\right) - x\left(\left[\frac{3N}{4} - 1 - n\right] \mod N\right)\right\} \text{ for } 0 \leq n < \frac{N}{2},$$

and said forward transform means generates spectral coefficients C(k) by applying a discrete transform function substantially corresponding to a Discrete Cosine Transform function to said first modified-sample blocks and generates spectral coefficients S(k) by applying a discrete transform function substantially corresponding to a Discrete Sine Transform function to said second modified-sample blocks.

3. The combination according to claim 1 wherein said forward pretransform means generates first modified-sample blocks comprising modified samples p(n) formed from the additive combination of a pair of analysis-window weighted samples x(n) from a respective one of said time-domain signal sample blocks according to $$p(n) = \frac{1}{2}\left\{x\left(\left[\frac{3N}{4} + 2n\right] \mod N\right) + x\left(\left[\frac{3N}{4} - 1 - 2n\right] \mod N\right)\right\} \text{ for } 0 \leq n < \frac{N}{2},$$

and said forward pretransform means generates second modified-sample blocks comprising modified samples r(n) formed from the subtractive combination of a pair of analysis-window weighted samples x(n) from another respective one of said time-domain signal sample blocks according to $$r(n) = \frac{1}{2}\left\{x\left(\left[\frac{3N}{4} + 2n\right] \mod N\right) - x\left(\left[\frac{3N}{4} - 1 - 2n\right] \mod N\right)\right\} \text{ for } 0 \leq n < \frac{N}{2},$$

said forward transform means generates a first set of complex-valued frequency-domain transform coefficients P(k) of the form T(k) +j·U(k) by applying a discrete transform function substantially corresponding to a Discrete Fourier Transform to said first modified-sample blocks and generates a second set of complex-valued frequency-domain transform coefficients R(k) of the form V(k)+j·W(k) by applying a discrete transform function substantially corresponding to a Discrete Fourier Transform to said second modified-sample blocks, and wherein said analysis means further comprises forward post-transform means for generating said spectral coefficients C(k) by applying a forward post-transform function to said first set of complex-valued frequency-domain transform coefficients according to $C(k)=\cos(\pi k/N)\cdot T(k)+\sin(\pi k/N)\cdot U(k)$ and for generating said spectral coefficients S(k) by applying a forward post-transform function to said second set of complex-valued frequency-domain transform coefficients according to $S(k)=\sin(\pi k/N)\cdot V(k)-\cos(\pi k/N)\cdot W(k)$.

4. The combination according to claim 1 wherein said forward pretransform means generates said modified-sample blocks comprising complex-valued modified samples q(n) of the form $p(n)+j\cdot r(n)$ wherein each p(n) is formed from the additive combination of a pair of analysis-window weighted samples x(n) from a respective one of said time-domain signal sample blocks according to $$p(n) = \frac{1}{2}\left\{ x\left(\left[\frac{3N}{4} + 2n\right]\mathrm{mod}\, N\right) + x\left(\left[\frac{3N}{4} - 1 - 2n\right]\mathrm{mod}\, N\right)\right\} \text{for } 0 \leq n < \frac{N}{2},$$

and each r(n) is formed from the subtractive combination of a pair of analysis-window weighted samples x(n) from another respective one of said time-domain signal sample blocks according $$\text{to } r(n) = \frac{1}{2}\left\{ x\left(\left[\frac{3N}{4} + 2n\right]\mathrm{mod}\, N\right) - x\left(\left[\frac{3N}{4} - 1 - 2n\right]\mathrm{mod}\, N\right)\right\} \text{for } 0 \leq n < \frac{N}{2},$$

said forward transform means generates a set of complex-valued frequency-domain transform coefficients Q(k) of the form $G(k)+j\cdot H(k)$ by applying a discrete transform substantially corresponding to a Discrete Fourier Transform to said modified-sample blocks, and wherein said analysis means further comprises forward post-transform means for generating said spectral coefficients C(k) by applying a forward post-transform function to said set of complex-valued frequency-domain transform coefficients according to $$C(k) = \frac{1}{2}\left\{ \cos\left(\frac{\pi k}{N}\right)\cdot\left[G(k) + G\left(\frac{N}{2} - k\right)\right] + \sin\left(\frac{\pi k}{N}\right)\cdot\left[H(k) - H\left(\frac{N}{2} - k\right)\right]\right\}$$

and for generating said spectral coefficients S(k) by applying a forward post-transform function to said set of complex-valued frequency-domain transform coefficients according to $$S(k) = \frac{1}{2}\left\{ \cos\left(\frac{\pi k}{N}\right)\cdot\left[G(k) - G\left(\frac{N}{2} - k\right)\right] + \sin\left(\frac{\pi k}{N}\right)\cdot\left[H(k) + H\left(\frac{N}{2} - k\right)\right]\right\}.$$

5. In an encoder a combination for the filtering of one or more signals comprising input samples, said combination comprising means for receiving said input samples representing stimuli intended for human perception, input buffer means for grouping said input samples into time-domain signal sample blocks of length a+b, where a and b are non-negative integers and the sum a+b is positive, wherein said length varies from block to block one or more times, and wherein said input samples are analysis-window weighted samples, forward pre-transform means for generating modified-sample blocks comprising ½(a+b) modified samples by combining pairs of analysis-window weighted samples to form said modified samples, forward transform means for generating frequency-domain transform coefficients by applying one or more discrete transform functions to said modified-sample blocks, and means for generating an encoded signal in response to said frequency-domain transform coefficients.

6. The combination according to claim 5 wherein said forward pretransform means generates first modified-sample blocks comprising modified samples y(n) formed from the additive combination of a pair of analysis-window weighted samples x(n) from a respective one of said time-domain signal sample blocks according to $$y(n) = \frac{1}{2}\left\{ x\left(\left[\frac{2a+b}{2} + n\right]\mathrm{mod}[a+b]\right) + x\left(\left[\frac{2a+b}{2} - 1 - n\right]\mathrm{mod}[a+b]\right)\right\} \text{for } 0 \leq n < \frac{a+b}{2},$$

and said forward pretransform means generates second modified-sample blocks comprising modified samples z(n) formed from the subtractive combination of a pair of analysis-window weighted samples x(n) from another respective one of said time-domain signal sample blocks according to $$z(n) = \frac{1}{2}\left\{ x\left(\left[\frac{2a+b}{2} + n\right]\mathrm{mod}[a+b]\right) - x\left(\left[\frac{2a+b}{2} - 1 - n\right]\mathrm{mod}[a+b]\right)\right\}$$

for $0 \leq n < \frac{a+b}{2}$, and said forward transform means generates spectral coefficients C(k) by applying a discrete transform function substantially corresponding to a Discrete Cosine Transform function to said first modified-sample blocks and generates spectral coefficients S(k) by applying a discrete transform function substantially corresponding to a Discrete Sine Transform function to said second modified-sample blocks.

7. The combination according to claim 5 wherein said forward pretransform means generates first modified-sample blocks comprising modified samples p(n) formed from the additive combination of a pair of analysis-window weighted samples x(n) from a respective one of said time-domain signal sample blocks according to $$p(n) = \frac{1}{2}\left( x\left(\left[\frac{2a+b}{2} + 2n\right]\mod[a+b]\right) + x\left(\left[\frac{2a+b}{2} - 1 - 2n\right]\mod[a+b]\right)\right) \text{for } 0 \leq n < \frac{a+b}{2},$$

and
said forward pretransform means generates second modified-sample blocks comprising modified samples r(n) formed from the subtractive combination of a pair of analysis-window weighted samples x(n) from another respective one of said time-domain signal sample blocks according to $$r(n) = \frac{1}{2}\left( x\left(\left[\frac{2a+b}{2} + 2n\right]\mod[a+b]\right) - x\left(\left[\frac{2a+b}{2} - 1 - 2n\right]\mod[a+b]\right)\right) \text{for } 0 \leq n < \frac{a+b}{2},$$

said forward transform means generates a first set of complex-valued frequency-domain transform coefficients P(k) of the form T(k)+j·U(k) by applying a discrete transform function substantially corresponding to a Discrete Fourier Transform to said first modified-sample blocks and generates a second set of complex-valued frequency-domain transform coefficients R(k) of the form V(k)+j·W(k) by applying a discrete transform function substantially corresponding to a Discrete Fourier Transform to said second modified-sample blocks, and
wherein said encoder further comprises forward post-transform means for generating spectral coefficients C(k) by applying a forward post-transform function to said first set of complex-valued frequency-domain transform coefficients according to $$C(k) = \cos\left(\frac{\pi k}{a+b}\right) \cdot T(k) + \sin\left(\frac{\pi k}{a+b}\right) \cdot U(k)$$

and for generating spectral coefficients S(k) by applying a forward post-transform function to said second set of complex-valued frequency-domain transform coefficients according to $$S(k) = \sin\left(\frac{\pi k}{a+b}\right) \cdot V(k) - \cos\left(\frac{\pi k}{a+b}\right) \cdot W(k).$$

8. The combination according to claim 5 wherein said forward pretransform means generates said modified-sample blocks comprising modified samples e(n) formed from the combination of a pair of analysis-window weighted samples x(n) from a respective one of said time-domain signal sample blocks according to $$e(n) = x\left(\left[\frac{a}{2} + n\right]\mod[a+b]\right) - x\left(\left[\frac{a}{2} - 1 - n\right]\mod[a+b]\right) \text{for } 0 \leq n < \frac{a}{2} \text{ and}$$

$$e(n) = x\left(\left[\frac{a}{2} + n\right]\mod[a+b]\right) + x\left(\left[\frac{a}{2} - 1 - n\right]\mod[a+b]\right) \text{for } \frac{a}{2} \leq n < \frac{a+b}{2}, \text{ and}$$

said forward transform means generates said spectral information by applying a discrete transform function substantially corresponding to a Discrete Sine Transform function to said modified-sample blocks.

9. In a decoder a combination for the inverse filtering of one or more digital signals comprising spectral information, said combination comprising
means for receiving said spectral information,
synthesis means for generating signal samples in response to said spectral information, said signal samples substantially corresponding to the time-domain transform coefficients of an Evenly-Stacked Time-Domain Aliasing Cancellation transform applied to said spectral information, comprising
inverse pre-transform means for generating sets of frequency-domain transform coefficients in response to said spectral information,
inverse transform means for generating transform blocks comprising time-domain transform coefficients by applying an inverse discrete transform function to said sets of frequency-domain transform coefficients, and
inverse post-transform means for generating time-domain signal sample blocks comprising N signal samples, wherein one or more pairs of signal samples are generated from a respective one of said time-domain transform coefficients, and
output means for generating output samples representing stimuli intended for human perception by overlapping pairs of said time-domain signal sample blocks and additively combining signal samples from each of said overlapped blocks.

10. The combination according to claim 9 wherein said inverse transform means generates transform blocks comprising time-domain transform coefficients ŷ(n) by applying an inverse discrete transform function substantially corresponding to an Inverse Discrete Cosine Transform function to a respective one of said sets of frequency-domain transform coefficients, and generates transform blocks comprising time-domain transform coefficients ẑ(n) by applying an inverse discrete transform function substantially corresponding to an Inverse Discrete Sine Transform function to another respective one of said sets of frequency-domain transform coefficients, and said inverse post-transform means generates time-domain signal sample blocks comprising signal samples x̂(n) by applying an inverse post-transform function to time-domain transform coefficients ŷ(n) according to $$\hat{x}(n) = \hat{y}\left(\left[n - \frac{3N}{4}\right] \bmod N\right)$$

for $0 \leq n < \frac{N}{4}$, $\frac{3N}{4} \leq n < N$ and $$\hat{x}(n) = \hat{y}\left(\left[\frac{3N}{4} - 1 - n\right] \bmod N\right) \text{ for } \frac{N}{4} \leq n < \frac{3N}{4},$$

and by applying an inverse post-transform function to time-domain transform coefficients ẑ(n) according to $$\hat{x}(n) = \hat{z}\left(\left[n - \frac{3N}{4}\right] \bmod N\right)$$

for $0 \leq n < \frac{N}{4}$, $\frac{3N}{4} \leq n < N$ and $$\hat{x}(n) = -\hat{z}\left(\left[\frac{3N}{4} - 1 - n\right] \bmod N\right) \text{ for } \frac{N}{4} \leq n < \frac{3N}{4}.$$

11. The combination according to claim 9 wherein said spectral information comprises blocks of spectral coefficients Ĉ(k) and blocks of spectral coefficients Ŝ(k), wherein said spectral coefficients Ĉ(k) and Ŝ(k) substantially correspond to Modified Discrete Cosine Transform coefficients and Modified Discrete Sine Transform coefficients of an Evenly-Stacked Time-Domain Aliasing Cancellation transform, respectively, and wherein said inverse pretransform means generates first sets of frequency-domain transform coefficients P̂(k) of the form T̂(k)+j·Û(k) according to $$\hat{T}(k) = \cos\left(\frac{\pi k}{N}\right) \cdot \hat{C}(k) + \sin\left(\frac{\pi k}{N}\right) \cdot \hat{C}\left(\frac{N}{2} - k\right) \text{ and}$$

$$\hat{U}(k) = \sin\left(\frac{\pi k}{N}\right) \cdot \hat{C}(k) - \cos\left(\frac{\pi k}{N}\right) \cdot \hat{C}\left(\frac{N}{2} - k\right),$$

and generates second sets of frequency-domain transform coefficients R(k) of the form $$\hat{V}(k) + j \cdot \hat{W}(k) \text{ according to } \hat{V}(k) = \cos\left(\frac{\pi k}{N}\right) \cdot$$

$$\hat{S}\left(\frac{N}{2} - k\right) + \sin\left(\frac{\pi k}{N}\right) \cdot \hat{S}(k) \text{ and}$$

$$\hat{W}(k) = \sin\left(\frac{\pi k}{N}\right) \cdot \hat{S}\left(\frac{N}{2} - k\right) - \cos\left(\frac{\pi k}{N}\right) \cdot \hat{S}(k),$$

said inverse transform means generates transform blocks comprising time-domain transform coefficients p̂(n) by applying an inverse discrete transform function substantially corresponding to an Inverse Discrete Fourier Transform function to said first sets of frequency-domain transform coefficients, and generates transform blocks comprising time-domain transform coefficients r̂(n) by applying an inverse discrete transform function substantially corresponding to an Inverse Discrete Fourier Transform function to said second sets of frequency-domain transform coefficients, and said inverse post-transform means generates time-domain signal sample blocks comprising signal samples x̂(n) by applying an inverse post-transform function to time-domain transform coefficients p̂(n) according to $$\hat{x}(n) = \hat{p}\left(\left[\frac{4n - 3N}{8}\right] \bmod \left[\frac{N}{2}\right]\right) \text{ for } 0 \leq n < N, n$$

even and $$\hat{x}(n) = \hat{p}\left(\left[\frac{3N - 4 - 4n}{8}\right] \bmod \left[\frac{N}{2}\right]\right) \text{ for } 0 \leq n < N, n \text{ odd,}$$

and by applying an inverse post-transform function to time-domain transform coefficients r̂(n) according to $$\hat{x}(n) = \hat{r}\left(\left[\frac{4n - 3N}{8}\right] \bmod \left[\frac{N}{2}\right]\right) \text{ for } 0 \leq n < N,$$

$$n \text{ even and } \hat{x}(n) = -\hat{r}\left(\left[\frac{3N - 4 - 4n}{8}\right] \bmod \left[\frac{N}{2}\right]\right)$$

for $0 \leq n < N$, $n$ odd.

12. The combination according to claim 9 wherein said spectral information comprises blocks of spectral coefficients Ĉ(k) and blocks of spectral coefficients Ŝ(k), wherein said spectral coefficients Ĉ(k) and Ŝ(k) substantially correspond to Modified Discrete Cosine Transform coefficients and Modified Discrete Sine Transform coefficients of an Evenly-Stacked Time-Domain Aliasing Cancellation transform, respectively, and wherein said inverse pretransform means generates sets of frequency-domain transform coefficients Q̂(k) of the form Ĝ(k)+j·Ĥ(k) according to $$\hat{G}(k) = \cos\left(\frac{\pi k}{N}\right) \cdot [\hat{C}(k) + \hat{S}(k)] +$$

$$\sin\left(\frac{\pi k}{N}\right) \cdot \left[\hat{C}\left(\frac{N}{2} - k\right) - \hat{S}\left(\frac{N}{2} - k\right)\right] \text{ and}$$

$$\hat{H}(k) = \sin\left(\frac{\pi k}{N}\right) \cdot [\hat{C}(k) + \hat{S}(k)] - \cos\left(\frac{\pi k}{N}\right) \cdot$$

$$\left[\hat{C}\left(\frac{N}{2} - k\right) - \hat{S}\left(\frac{N}{2} - k\right)\right],$$

said inverse transform means generates transform blocks comprising complex-valued time-domain transform coefficients $\hat{q}(n)$ of the form $\hat{p}(n)+j\cdot\hat{r}(n)$ by applying an inverse discrete transform substantially corresponding to an Inverse Discrete Fourier Transform, and said inverse post-transform means generates time-domain signal sample blocks comprising signal samples $\hat{x}(n)$ by applying an inverse post-transform function to $\hat{p}(n)$ according to $$\hat{x}(n) = \hat{p}\left(\left[\frac{4n - 3N}{8}\right]\bmod\left[\frac{N}{2}\right]\right) \text{ for } 0 \leq n < N, n \text{ even and}$$

$$\hat{x}(n) = \hat{p}\left(\left[\frac{3N - 4 - 4n}{8}\right]\bmod\left[\frac{N}{2}\right]\right) \text{ for } 0 \leq n < N, n \text{ odd,}$$

and by applying an inverse post-transform function to r(n) according to $$\hat{x}(n) = \hat{r}\left(\left[\frac{4n - 3N}{8}\right]\bmod\left[\frac{N}{2}\right]\right) \text{ for } 0 \leq In < N, n \text{ even and}$$

$$\hat{x}(n) =$$

$$-\hat{r}\left(\left[\frac{3N - 4 - 4n}{8}\right]\bmod\left[\frac{N}{2}\right]\right) \text{ for } 0 \leq n < N, n \text{ odd.}$$

13. The combination according to claim 9 wherein said inverse transform means generates transform blocks comprising $\frac{1}{2}N$ time-domain transform coefficients.

14. In a decoder a combination for the inverse filtering of one or more digital signals comprising spectral information, said combination comprising means for receiving said spectral information.

inverse pre-transform means for generating sets of frequency-domain transform coefficients in response to said spectral information, said set comprising $\frac{1}{2}(a+b)$ coefficients wherein the number of coefficients varies from set to set one or more times, inverse transform means for generating transform blocks comprising time-domain transform coefficients by applying one or more inverse discrete transform functions to said set of frequency-domain transform efficients, inverse post-transform means for generating time-domain signal sample blocks comprising a+b signal samples, wherein a pair of signal samples is generated from a respective one of said time-domain transform coefficients, and output means for generating output samples representing stimuli intended for human perception by overlapping pairs of said time-domain signal sample blocks and additively combining signal samples from each of said overlapped blocks.

15. The combination according to claim 14 wherein said inverse transform means generates transform blocks comprising time-domain transform coefficients $\hat{y}(n)$ by applying an inverse discrete transform function substantially corresponding to an Inverse Discrete Cosine Transform function to a respective one of said sets of frequency-domain transform coefficients, and generates transform blocks comprising time-domain transform coefficients $\hat{z}(n)$ by applying an inverse discrete transform function substantially corresponding to an Inverse Discrete Sine Transform function to another respective one of said sets of frequency-domain transform coefficients, and said inverse post-transform means generates time-domain signal sample blocks comprising signal samples $\hat{x}(n)$ by applying an inverse post-transform function to time-domain transform coefficients $\hat{y}(n)$ according to $$\hat{x}(n) = \hat{y}\left(\left[n - \frac{2a + b}{2}\right]\bmod[a + b]\right)$$

$$\text{for } 0 \leq n < \frac{a}{2}, \frac{2a + b}{2} \leq n < a + b \text{ and}$$

$$\hat{x}(n) = \hat{y}\left(\left[\frac{2a + b}{2} - 1 - n\right]\bmod[a + b]\right)$$

$$\text{for } \frac{a}{2} \leq n < \frac{2a + b}{2},$$

and by applying an inverse post-transform function to time-domain transform coefficients $\hat{z}(n)$ according to $$\hat{x}(n) = \hat{z}\left(\left[n - \frac{2a + b}{2}\right]\bmod[a + b]\right)$$

$$\text{for } 0 \leq n < \frac{a}{2}, \frac{2a + b}{2} \leq n < a + b \text{ and}$$

$$\hat{x}(n) = -\hat{z}\left(\left[\frac{2a + b}{2} - 1 - n\right]\bmod[a + b]\right)$$

$$\text{for } \frac{a}{2} \leq n < \frac{2a + b}{2}.$$

16. The combination according to claim 14 wherein said spectral information comprises blocks of spectral coefficients $\hat{C}(k)$ and blocks of spectral coefficients $\hat{S}(k)$, wherein said spectral coefficients $\hat{C}(k)$ and $\hat{S}(k)$ substantially correspond to Modified Discrete Cosine Transform coefficients and Modified Discrete Sine Transform coefficients of an Evenly-Stacked Time-Domain Aliasing Cancellation transform, respectively, and wherein said inverse pretransform means generates first sets of frequency-domain transform coefficients $\hat{P}(k)$ of the form $\hat{T}(k)+j\cdot\hat{U}(k)$ according to $$\hat{T}(k) = \cos\left(\frac{\pi k}{a + b}\right)\cdot$$

$$\hat{C}(k) + \sin\left(\frac{\pi k}{a + b}\right)\cdot\hat{C}\left(\frac{a + b}{2} - k\right) \text{ and}$$

$$\hat{U}(k) = \sin\left(\frac{\pi k}{a + b}\right)\cdot$$

$$\hat{C}(k) - \cos\left(\frac{\pi k}{a + b}\right)\cdot\hat{C}\left(\frac{a + b}{2} - k\right), \text{ and}$$

generates second sets of frequency domain transform coefficients $\hat{R}(k)$ of the form $\hat{V}(k) + j \cdot \hat{W}(k)$ according to $$\hat{V}(k) = \cos\left(\frac{\pi k}{a+b}\right) \cdot \hat{S}\left(\frac{a+b}{2} - k\right) +$$

$$\sin\left(\frac{\pi k}{a+b}\right) \cdot \hat{S}(k) \text{ and}$$

$$\hat{W}(k) = \sin\left(\frac{\pi k}{a+b}\right) \cdot \hat{S}\left(\frac{a+b}{2} - k\right) -$$

$$\cos\left(\frac{\pi k}{a+b}\right) \cdot \hat{S}(k),$$

said inverse transform means generates transform blocks comprising time-domain transform coefficients $\hat{p}(n)$ by applying an inverse discrete transform function substantially corresponding to an Inverse Discrete Fourier Transform function to said first sets of frequency-domain transform coefficients, and generates transform blocks comprising time-domain transform coefficients $\hat{r}(n)$ by applying an inverse discrete transform function substantially corresponding to an Inverse Discrete Fourier Transform function to said second sets of frequency-domain transform coefficients, and said inverse post-transform means generates time-domain signal sample blocks comprising signal samples $\hat{x}(n)$ by applying an inverse post-transform function to time-domain transform coefficients $\hat{p}(n)$ according to $$\hat{x}(n) = \hat{p}\left(\left[\frac{2n - 2a - b}{4}\right] \mod \left[\frac{a+b}{2}\right]\right) \text{ for}$$

$0 \leq n < a + b$, $n$ even and $\hat{x}(n) =$ $$\hat{p}\left(\left[\frac{2a + b - 2 - 2n}{4}\right] \mod \left[\frac{a+b}{2}\right]\right) \text{ for } 0 \leq n < a + b,$$

$n$ odd, and by applying an inverse post-transform function to time-domain transform coefficients $\hat{r}(n)$ according to $\hat{x}(n) =$ $$\hat{r}\left(\left[\frac{2n - 2a - b}{4}\right] \mod \left[\frac{a+b}{2}\right]\right) \text{ for } 0 \leq n < a + b,$$

$n$ even and $\hat{x}(n) = -\hat{r}\left(\left[\frac{2a + b - 2 - 2n}{4}\right] \mod \left[\frac{a+b}{2}\right]\right)$ for $0 \leq n < a + b$, $n$ odd.

17. The combination according to claim 14 wherein said inverse transform means generates transform blocks comprising time-domain transform coefficients $\hat{e}(n)$ by applying an inverse discrete transform function substantially corresponding to an Inverse Discrete Sine Transform to said sets of frequency-domain transform coefficients, and wherein said inverse post-transform means generates time-domain signal sample blocks comprising signal samples $\hat{x}(n)$ by applying an inverse post-transform function to time-domain transform coefficients $\hat{e}(n)$ according to $$\hat{x}(n) = -\hat{e}\left(\left[\frac{a}{2} - 1 - n\right] \mod[a+b]\right) \text{ for } 0 \leq n < \frac{a}{2},$$

$$\hat{x}(n) = \hat{e}\left(\left[n - \frac{a}{2}\right] \mod[a+b]\right) \text{ for } \frac{a}{2} \leq n < \frac{2a+b}{2}, \text{ and}$$

$$\hat{x}(n) =$$

$$\hat{e}\left(\left[\frac{a}{2} - 1 - n\right] \mod[a+b]\right) \text{ for } \frac{2a+b}{2} \leq n < a + b.$$

18. In an encoding method a combination for the filtering of one or more signals comprising input samples, said combination comprising receiving said input samples representing stimuli intended for human perception, grouping said input samples into time-domain signal sample blocks of length N, where N is a positive integer, wherein said input samples are analysis-window weighted samples, generating spectral information in response to said time-domain signal sample blocks, said spectral information comprising spectral coefficients C(k) and S(k) substantially corresponding to the frequency-domain transform coefficients of an Evenly-Stacked Time-Domain Aliasing Cancellation transform applied to said time-domain signal sample blocks, wherein said spectral coefficients C(k) and S(k) substantially correspond to Modified Discrete Cosine Transform coefficients and Modified Discrete Sine Transform coefficients, respectively, comprising generating modified-sample blocks comprising $\frac{1}{2}$N modified samples by combining one or more pairs of analysis-window weighted samples to form said modified samples, and generating frequency-domain transform coefficients by applying one or more discrete transform functions to said modified-sample blocks, and generating an encoded signal in response to said spectral information.

19. The combination according to claim 18 wherein said generating modified-sample blocks generates first modified-sample blocks comprising modified samples y(n) formed from the additive combination of a pair of analysis-window weighted samples x(n) from a respective one of said time-domain signal sample blocks according to $$y(n) = \frac{1}{2}\left\{x\left(\left[\frac{3N}{4} + n\right] \mod N\right) + x\left(\left[\frac{3N}{4} - 1 - n\right] \mod N\right)\right\} \text{for } 0 \leq n < \frac{N}{2},$$

and generates second modified-sample blocks comprising modified samples z(n) formed from the subtractive combination of a pair of analysis-window weighted samples x(n) from another respective one of said time-domain signal sample blocks according to $$x(n) = \frac{1}{2}\left\{ x\left(\left[\frac{3N}{4} + n\right] \bmod N\right) - x\left(\left[\frac{3N}{4} - 1 - n\right] \bmod N\right)\right\} \text{for } 0 \leq n < \frac{N}{2},$$

and
said generating frequency-domain transform coefficients generates spectral coefficients C(k) by applying a discrete transform function substantially corresponding to a Discrete Cosine Transform function to said first modified-sample blocks and generates spectral coefficients S(k) by applying a discrete transform function substantially corresponding to a Discrete Sine Transform function to said second modified-sample blocks.

20. The combination according to claim 18 wherein said generating modified ample blocks generates first modified amp e blocks comprising modified samples p(n) formed from the additive combination of a pair of analysis window weighted samples x(n) from a respective one of said time-domain signal sample blocks according to $$p(n) = \frac{1}{2}\left\{ x\left(\left[\frac{3N}{4} + 2n\right] \bmod N\right) + x\left(\left[\frac{3N}{4} - 1 - 2n\right] \bmod N\right)\right\} \text{for } 0 \leq n < \frac{N}{2},$$

and generates second modified-sample blocks comprising modified samples r(n) formed from the subtractive combination of a pair of analysis-window weighted samples x(n) from another respective one of said time-domain signal sample blocks according to $$r(n) = \frac{1}{2}\left\{ x\left(\left[\frac{3N}{4} + 2n\right] \bmod N\right) - x\left(\left[\frac{3N}{4} - 1 - 2n\right] \bmod N\right)\right\} \text{for } 0 \leq n < \frac{N}{2},$$

said generating frequency-domain transform coefficients generates a first set of complex-valued frequency-domain transform coefficients P(k) of the form T(k)+j·U(k) by applying a discrete transform function substantially corresponding to a Discrete Fourier Transform to said first modified-sample blocks and generates a second set of complex-valued frequency-domain transform coefficients R(k) of the form V(k)+j·W(k) by applying a discrete transform function substantially corresponding to a Discrete Fourier Transform to said second modified-sample blocks, and wherein said generating spectral information further comprises generating said spectral coefficients C(k) by applying a forward post-transform function to said first set of complex-valued frequency-domain transform coefficients according to C(k)=cos(πk/N)·T(k)-+sin(πk/N)·U(k) and generating said spectral coefficients S(k) by applying a forward post-transform function to said second set of complex-valued frequency-domain transform coefficients according to S(k)=sin(πk/N)·V(k)−cos(πk/N)·W(k).

21. The combination according to claim 18 wherein said generating modified-sample blocks generates said modified-sample blocks comprising complex-valued modified samples q(n) of the form p(n)+j·r(n) wherein each p(n) is formed from the additive combination of a pair of analysis-window weighted samples x(n) from a respective one of said time-domain signal sample blocks according to $$p(n) = \frac{1}{2}\left\{ x\left(\left[\frac{3N}{4} + 2n\right] \bmod N\right) + x\left(\left[\frac{3N}{4} - 1 - 2n\right] \bmod N\right)\right\} \text{for } 0 \leq n < \frac{N}{2},$$

and each r(n) is formed from the subtractive combination of a pair of analysis-window weighted samples x(n) from another respective one of said time-domain signal sample blocks according $$r(n) = \frac{1}{2}\left\{ x\left(\left[\frac{3N}{4} + 2n\right] \bmod N\right) - x\left(\left[\frac{3N}{4} - 1 - 2n\right] \bmod N\right)\right\} \text{for } 0 \leq n < \frac{N}{2},$$

said generating frequency-domain transform coefficients generates a set of complex-valued frequency-domain transform coefficients Q(k) of the form G(k)+j·H(k) by applying a discrete transform substantially corresponding to a Discrete Fourier Transform to said modified-sample blocks, and wherein said generating spectral information further comprises generating said spectral coefficients C(k) by applying a forward post-transform function to said set of complex-valued frequency-domain transform coefficients according to $$C(k) = \frac{1}{2}\left\{ \cos\left(\frac{\pi k}{N}\right) \cdot \left[G(k) + G\left(\frac{N}{2} - k\right)\right] + \sin\left(\frac{\pi k}{N}\right) \cdot \left[H(k) - H\left(\frac{N}{2} - k\right)\right]\right\}$$

and generating said spectral coefficients S(k) by applying a forward post-transform function to said set of complex-valued frequency-domain transform coefficients according to $$S(k) = \frac{1}{2}\left\{ \cos\left(\frac{\pi k}{N}\right) \cdot \left[G(k) - G\left(\frac{N}{2} - k\right)\right] + \sin\left(\frac{\pi k}{N}\right) \cdot \left[H(k) + H\left(\frac{N}{2} - k\right)\right]\right\}.$$

22. In an encoding method a combination for the filtering of one or more signals comprising input samples, said combination comprising
  receiving said input samples representing stimuli intended for human perception,
  grouping said input samples into time-domain signal sample blocks of length a+b, where a and b are non-negative integers and the sum a+b is positive, wherein said length varies from block to block one or more times, and wherein said input samples are analysis-window weighted samples,
  generating modified-sample blocks comprising ½(a+b) modified samples by combining pairs of analysis-window weighted samples to form said modified samples,
  generating frequency-domain transform coefficients by applying one or more discrete transform functions to said modified-sample blocks, and
  generating an encoded signal in response to said frequency-domain transform coefficients.

23. The combination according to claim 22 wherein said generating modified-sample blocks generates first modified-sample blocks comprising modified samples y(n) formed from the additive combination of a pair of analysis-window weighted samples x(n) from a respective one of said time-domain signal sample blocks according to $$y(n) = \frac{1}{2}\left\{ x\left(\left[\frac{2a+b}{2}+n\right]\text{mod}[a+b]\right) + x\left(\left[\frac{2a+b}{2}-1-n\right]\text{mod}[a+b]\right)\right\} \text{for } 0 \leq n < \frac{a+b}{2},$$

and generates second modified-sample blocks comprising modified samples z(n) formed from the subtractive combination of a pair of analysis-window weighted samples x(n) from another respective one of said time-domain signal sample blocks according to $$z(n) = \frac{1}{2}\left\{ x\left(\left[\frac{2a+b}{2}+n\right]\text{mod}[a+b]\right) - x\left(\left[\frac{2a+b}{2}-1-n\right]\text{mod}[a+b]\right)\right\} \text{for } 0 \leq n < \frac{a+b}{2},$$

and
  said generating frequency-domain transform coefficients generates spectral coefficients C(k) by applying a discrete transform function substantially corresponding to a Discrete Cosine Transform function to said first modified-sample blocks and generates spectral coefficients S(k) by applying a discrete transform function substantially corresponding to a Discrete Sine Transform function to said second modified-sample blocks.

24. The combination according to claim 22 wherein said generating modified-sample blocks generates first modified-sample blocks comprising modified samples p(n) formed from the additive combination of a pair of analysis-window weighted samples x(n) from a respective one of said time-domain signal sample blocks according to $$p(n) = \frac{1}{2}\left\{ x\left(\left[\frac{2a+b}{2}+2n\right]\text{mod}[a+b]\right) + x\left(\left[\frac{2a+b}{2}-1-2n\right]\text{mod}[a+b]\right)\right\} \text{for } 0 \leq n < \frac{a+b}{2},$$

and generates second modified-sample blocks comprising modified samples r(n) formed from the subtractive combination of a pair of analysis-window weighted samples x(n) from another respective one of said time-domain signal sample blocks according to $$r(n) = \frac{1}{2}\left\{ x\left(\left[\frac{2a+b}{2}+2n\right]\text{mod}[a+b]\right) - x\left(\left[\frac{2a+b}{2}-1-2n\right]\text{mod}[a+b]\right)\right\} \text{for } 0 \leq n < \frac{a+b}{2},$$

said generating frequency-domain transform coefficients generates a first set of complex-valued frequency-domain transform coefficients P(k) of the form T(k)+j·U(k) by applying a discrete transform function substantially corresponding to a Discrete Fourier Transform to said first modified-sample blocks and generates a second set of complex-valued frequency-domain transform coefficients R(k) of the form V(k)+j·W(k) by applying a discrete transform function substantially corresponding to a Discrete Fourier Transform to said second modified-sample blocks, and
wherein said encoding method further comprises generating spectral coefficients C(k) by applying a forward post-transform function to said first set of complex-valued frequency-domain transform coefficients according to C(k)=cos(πk/a+b)·T(k)+sin(πk/a+b)·U(k) and generating spectral coefficients S(k) by applying a forward post-transform function to said second set of complex-valued frequency-domain transform coefficients according to S(k)=sin(πk/a+b)·V(k)−cos(πk/a+b)·W(k).

25. The combination according to claim 22 wherein said generating modified-sample blocks generates said modified-sample blocks comprising modified samples e(n) formed from the combination of a pair of analysis-window weighted samples x(n) from a respective one of said time-domain signal sample blocks according to $$e(n) = x\left(\left[\frac{a}{2}+n\right]\text{mod}[a+b]\right) - x\left(\left[\frac{a}{2}-1-n\right]\text{mod}[a+b]\right) \text{for } 0 \leq n < \frac{a}{2} \text{ and}$$

$$e(n) = x\left(\left[\frac{a}{2}+n\right]\text{mod}[a+b]\right) + x\left(\left[\frac{a}{2}-1-n\right]\text{mod}[a+b]\right) \text{for } \frac{a}{2} \leq n < \frac{a+b}{2},$$

and said generating frequency-domain transform coefficients generates said spectral information by applying a discrete transform function substantially corresponding to a Discrete Sine Transform function to said modified-sample blocks.

26. In a decoding method a combination for the inverse filtering of one or more digital signals comprising spectral information, said combination comprising
receiving said spectral information,
generating signal samples in response to said spectral information, said signal samples substantially corresponding to the time-domain transform coefficients of an Evenly-Stacked Time-Domain Aliasing Cancellation transform applied to said spectral information, comprising
generating sets of frequency-domain transform coefficients in response to said spectral information,
generating transform blocks comprising time-domain transform coefficients by applying an inverse discrete transform function to said sets of frequency-domain transform coefficients, and
generating time-domain signal sample blocks comprising N signal samples, wherein one or more pairs of signal samples are generated from a respective one of said time-domain transform coefficients, and
generating output samples representing stimuli intended for human perception by overlapping pairs of said time-domain signal sample blocks and additively combining signal samples from each of said overlapped blocks.

27. The combination according to claim 26 wherein
said generating transform blocks generates transform blocks comprising time-domain transform coefficients $\hat{y}(n)$ by applying an inverse discrete transform function substantially corresponding to an Inverse Discrete Cosine Transform function to a respective one of said sets of frequency-domain transform coefficients, and generates transform blocks comprising time-domain transform coefficients $\hat{z}(n)$ by applying an inverse discrete transform function substantially corresponding to an Inverse Discrete Sine Transform function to another respective one of said sets of frequency-domain transform coefficients, and
said generating time-domain signal sample blocks generates time-domain signal sample blocks comprising signal samples $\hat{x}(n)$ by applying an inverse post-transform function to time-domain transform coefficients $\hat{y}(n)$ according to $\hat{x}(n) =$ $\hat{y}\left(\left[n - \frac{3N}{4}\right]\mod N\right)$ for $0 \leq n < \frac{N}{4}, \frac{3N}{4} \leq n < N$ and $\hat{x}(n) = \hat{y}\left(\left[\frac{3N}{4} - 1 - n\right]\mod N\right)$ for $\frac{N}{4} \leq n < \frac{3N}{4}$, and by applying an inverse post-transform function to time-domain transform coefficients $\hat{z}(n)$ according to $\hat{x}(n) =$ -continued $\hat{z}\left(\left[n - \frac{3N}{4}\right]\mod N\right)$ for $0 \leq n < \frac{N}{4}, \frac{3N}{4} \leq n < N$ and $\hat{x}(n) = -\hat{z}\left(\left[\frac{3N}{4} - 1 - n\right]\mod N\right)$ for $\frac{N}{4} \leq n < \frac{3N}{4}$.

28. The combination according to claim 26 wherein said spectral information comprises blocks of spectral coefficients $\hat{C}(k)$ and blocks of spectral coefficients $\hat{S}(k)$, wherein said spectral coefficients $\hat{C}(k)$ and $\hat{S}(k)$ substantially correspond to Modified Discrete Cosine Transform coefficients and Modified Discrete Sine Transform coefficients of an Evenly-Stacked Time-Domain Aliasing Cancellation transform, respectively, and wherein
said generating sets of frequency-domain transform coefficients generates first sets of frequency-domain transform coefficients $\hat{P}(k)$ of the form $\hat{T}(k)+j\cdot\hat{U}(k)$ according to $\hat{T}(k)=\cos(\pi k/N)\cdot\hat{C}(k)+\sin(\pi k/N)\cdot\hat{C}(N/2-k)$ and $\hat{U}(k)=\sin(\pi k/N)\cdot\hat{C}(k)-\cos(\pi k/N)\cdot\hat{C}(N/2-k)$, and generates second sets of frequency-domain transform coefficients $\hat{R}(k)$ of the form $\hat{V}(k)+j\cdot\hat{W}(k)$ according to $\hat{V}(k)=\cos(\pi k/N)\cdot\hat{S}(N/2-k)+\sin(\pi k/N)\cdot\hat{S}(k)$ and $\hat{W}(k)=\sin(\pi k/N)\cdot\hat{S}(N/2-k)-\cos(\pi k/N)\cdot\hat{S}(k)$,
said generating transform blocks generates transform blocks comprising time-domain transform coefficients $\hat{p}(n)$ by applying an inverse discrete transform function substantially corresponding to an Inverse Discrete Fourier Transform function to said first sets of frequency-domain transform coefficients, and generates transform blocks comprising time-domain transform coefficients $\hat{r}(n)$ by applying an inverse discrete transform function substantially corresponding to an Inverse Discrete Fourier Transform function to said second sets of frequency-domain transform coefficients, and
said generating time-domain signal sample blocks generates time-domain signal sample blocks comprising signal samples $\hat{x}(n)$ by applying an inverse post-transform function to time-domain transform coefficients $\hat{p}(n)$ according to $\hat{x}(n) = \hat{p}\left(\left[\frac{4n - 3N}{8}\right]\mod\left[\frac{N}{2}\right]\right)$ for $0 \leq n < N$, $n$ even and $\hat{x}(n) =$ $\hat{p}\left(\left[\frac{3N - 4 - 4n}{8}\right]\mod\left[\frac{N}{2}\right]\right)$ for $0 \leq n < N$, $n$ odd, and by applying an inverse post-transform function to time-domain transform coefficients $\hat{r}(n)$ according to $\hat{x}(n) = \hat{r}\left(\left[\frac{4n - 3N}{8}\right]\mod\left[\frac{N}{2}\right]\right)$ for $0 \leq n < N$, $n$ even and $\hat{x}(n) = -\hat{r}\left(\left[\frac{3N - 4 - 4n}{8}\right]\mod\left[\frac{N}{2}\right]\right)$ for $0 \leq n < N$, $n$ odd.

29. The combination according to claim 26 wherein said spectral information comprises blocks of spectral coefficients $\hat{C}(k)$ and blocks of spectral coefficients $\hat{S}(k)$, wherein said spectral coefficients $\hat{C}(k)$ and $\hat{S}(k)$ substantially correspond to Modified Discrete Cosine Transform coefficients and Modified Discrete Sine Transform coefficients of an Evenly-Stacked Time-Domain Aliasing Cancellation transform, respectively, and wherein said generating sets of frequency-domain transform coefficients generates sets of frequency-domain transform coefficients $\hat{Q}(k)$ of the form $\hat{G}(k)+j\cdot\hat{H}(k)$ according to $$\hat{G}(k) = \cos\left(\frac{\pi k}{N}\right) \cdot [\hat{C}(k) + \hat{S}(k))] +$$

$$\sin\left(\frac{\pi k}{N}\right) \cdot \left[\hat{C}\left(\frac{N}{2} - k\right) - \hat{S}\left(\frac{N}{2} - k\right)\right] \text{ and}$$

$$\hat{H}(k) = \sin\left(\frac{\pi k}{N}\right) \cdot [\hat{C}(k) + \hat{S}(k))] -$$

$$\cos\left(\frac{\pi k}{N}\right) \cdot \left[\hat{C}\left(\frac{N}{2} - k\right) - \hat{S}\left(\frac{N}{2} - k\right)\right],$$

said generating transform blocks generates transform blocks comprising complex-valued time-domain transform coefficients $\hat{q}(n)$ of the form $\hat{p}(n)+j\cdot\hat{r}(n)$ by applying an inverse discrete transform substantially corresponding to an Inverse Discrete Fourier Transform, and said generating time-domain signal sample blocks generates time-domain signal sample blocks comprising signal samples $\hat{x}(n)$ by applying an inverse post-transform function to $\hat{p}(n)$ $$\hat{x}(n) = \hat{p}\left(\left[\frac{4n - 3N}{8}\right] \bmod \left[\frac{N}{2}\right]\right) \text{ for } 0 \leq n < N,$$

$n$ even and $$\hat{x}(n) = \hat{p}\left(\left[\frac{3N - 4 - 4n}{8}\right] \bmod \left[\frac{N}{2}\right]\right) \text{ for } 0 \leq n < N,$$

$n$ odd, and by applying an inverse post-transform function to $\hat{r}(n)$ according to $$\hat{x}(n) = \hat{r}\left(\left[\frac{4n - 3N}{8}\right] \bmod \left[\frac{N}{2}\right]\right) \text{ for } 0 \leq n < N,$$

$n$ even and $$x(n) = -\hat{r}\left(\left[\frac{3N - 4 - 4n}{8}\right] \bmod \left[\frac{N}{2}\right]\right) \text{ for } 0 \leq n < N,$$

$n$ odd.

30. The combination according to claim 26 wherein said generating transform blocks generates transform blocks comprising $\frac{1}{2}N$ time-domain transform coefficients.

31. In a decoding method a combination for the inverse filtering of one or more digital signals comprising spectral information, said combination comprising
receiving said spectral information,
generating sets of frequency-domain transform coefficients in response to said spectral information, said sets comprising $\frac{1}{2}(a+b)$ coefficients wherein the number of coefficients varies from set to set one or more times,
generating transform blocks comprising time-domain transform coefficients by applying one or more inverse discrete transform functions to said sets of frequency-domain transform coefficients,
generating time-domain signal sample blocks comprising $a+b$ signal samples, wherein a pair of signal samples is generated from a respective one of said time-domain transform coefficients, and
generating output samples representing stimuli intended for human perception by overlapping pairs of said time-domain signal sample blocks and additively combining signal samples from each of said overlapped blocks.

32. The combination according to claim 31 wherein said generating transform blocks generates transform blocks comprising time-domain transform coefficients $\hat{y}(n)$ by applying an inverse discrete transform function substantially corresponding to an Inverse Discrete Cosine Transform function to a respective one of said sets of frequency-domain transform coefficients, and generates transform blocks comprising time-domain transform coefficients $\hat{z}(n)$ by applying an inverse discrete transform function substantially corresponding to an Inverse Discrete Sine Transform function to another respective one of said sets of frequency-domain transform coefficients, and said generating time-domain signal sample blocks generates time-domain signal sample blocks comprising signal samples $\hat{x}(n)$ by applying an inverse post-transform function to time-domain transform coefficients $\hat{y}(n)$ according to $$\hat{x}(n) = \hat{y}\left(\left[n - \frac{2a + b}{2}\right] \bmod[a + b]\right)$$

for $0 \leq n < \frac{a}{2}, \frac{2a + b}{2} \leq n < a + b$ and $$\hat{x}(n) = \hat{y}\left(\left[\frac{2a + b}{2} - 1 - n\right] \bmod[a + b]\right)$$

for $\frac{a}{2} \leq n < \frac{2a + b}{2}$, and by applying an inverse post-transform function to time-domain transform coefficients $\hat{z}(n)$ according to $$\hat{x}(n) = \hat{z}\left(\left[n - \frac{2a + b}{2}\right] \bmod[a + b]\right)$$

for $0 \leq n < \frac{a}{2}, \frac{2a + b}{2} \leq n < a + b$ and $$\hat{x}(n) = -\hat{z}\left(\left[\frac{2a + b}{2} - 1 - n\right] \bmod[a + b]\right)$$

-continued for $\frac{a}{2} \leq n < \frac{2a+b}{2}$.

33. The combination according to claim 31 wherein said spectral information comprises blocks of spectral coefficients $\hat{C}(k)$ and blocks of spectral coefficients $\hat{S}(k)$, wherein said spectral coefficients $\hat{C}(k)$ and $\hat{S}(k)$ substantially correspond to Modified Discrete Cosine Transform coefficients and Modified Discrete Sine Transform coefficients of an Evenly-Stacked Time-Domain Aliasing Cancellation transform, respectively, and wherein said generating sets of frequency-domain transform coefficients generates first sets of frequency-domain transform coefficients $\hat{P}(k)$ of the form $\hat{T}(k)+j\cdot\hat{U}(k)$ according to $$\hat{T}(k) = \cos\left(\frac{\pi k}{a+b}\right) \cdot \hat{C}(k) +$$

$$\sin\left(\frac{\pi k}{a+b}\right) \cdot \hat{C}\left(\frac{a+b}{2} - k\right) \text{ and}$$

$$\hat{U}(k) = \sin\left(\frac{\pi k}{a+b}\right) \cdot \hat{C}(k) -$$

$$\cos\left(\frac{\pi k}{a+b}\right) \cdot \hat{C}\left(\frac{a+b}{2} - k\right),$$

and generates second sets of frequency-domain transform coefficient $\hat{R}(k)$ of the form $\hat{V}(k) + j \cdot \hat{W}(k)$ according to $$\hat{V}(k) = \cos\left(\frac{\pi k}{a+b}\right) \cdot \hat{S}\left(\frac{a+b}{2} - k\right) +$$

$$\sin\left(\frac{\pi k}{a+b}\right) \cdot \hat{S}(k) \text{ and}$$

$$\hat{W}(k) = \sin\left(\frac{\pi k}{a+b}\right) \cdot \hat{S}\left(\frac{a+b}{2} - k\right) -$$

$$\cos\left(\frac{\pi k}{a+b}\right) \cdot \hat{S}(k),$$

said generating transform blocks generates transform blocks comprising time-domain transform coefficients $\hat{p}(n)$ by applying an inverse discrete transform function substantially corresponding to an Inverse Discrete Fourier Transform function to said first sets of frequency-domain transform coefficients, and generates transform blocks comprising time-domain transform coefficients $\hat{r}(n)$ by applying an inverse discrete transform function substantially corresponding to an Inverse Discrete Fourier Transform function to said second sets of frequency-domain transform coefficients, and said generating time-domain signal sample blocks generates time-domain signal sample blocks comprising signal samples $\hat{x}(n)$ by applying an inverse post-transform function to time-domain transform coefficients $\hat{p}(n)$ according to $$\hat{x}(n) = \hat{p}\left(\left[\frac{2n - 2a - b}{4}\right] \bmod \left[\frac{a+b}{2}\right]\right)$$

for $0 \leq n < a + b$, $n$ even and $$\hat{x}(n) = \hat{p}\left(\left[\frac{2a + b - 2 - 2n}{4}\right] \bmod \left[\frac{a+b}{2}\right]\right)$$

for $0 \leq n < a + b$, $n$ odd, and by applying an inverse post-transform function to time-domain transform coefficients $\hat{r}(n)$ according to $$\hat{x}(n) = \hat{r}\left(\left[\frac{2n - 2a - b}{4}\right] \bmod \left[\frac{a+b}{2}\right]\right)$$

for $0 \leq n < a + b$, $n$ even and $$\hat{x}(n) = -\hat{r}\left(\left[\frac{2a + b - 2 - 2n}{4}\right] \bmod \left[\frac{a+b}{2}\right]\right)$$

for $0 \leq n < a + b$, $n$ odd.

34. The combination according to claim 31 wherein said generating transform blocks generates transform blocks comprising time-domain transform coefficients $\hat{e}(n)$ by applying an inverse discrete transform function substantially corresponding to an Inverse Discrete Sine Transform to said sets of frequency-domain transform coefficients, and wherein said generating time-domain signal sample blocks generates time-domain signal sample blocks comprising signal samples $\hat{x}(n)$ by applying an inverse post-transform function to time-domain transform coefficients $\hat{e}(n)$ according to $$\hat{x}(n) = -\hat{e}\left(\left[\frac{a}{2} - 1 - n\right] \bmod [a + b]\right)$$

for $0 \leq n < \frac{a}{2}$, $$\hat{x}(n) = \hat{e}\left(\left[n - \frac{a}{2}\right] \bmod [a + b]\right)$$

for $\frac{a}{2} \leq n < \frac{2a + b}{2}$, and $$\hat{x}(n) = \hat{e}\left(\left[\frac{a}{2} - 1 - n\right] \bmod [a + b]\right)$$

for $\frac{2a + b}{2} \leq n < a + b$.

* * * * *

UNITED STATES PATENT AND TRADEMARK OFFICE
CERTIFICATE OF CORRECTION

PATENT NO. : 5,297,236
DATED : 3/22/94
INVENTOR(S) : Michael B. Antill, Grant A. Davidson It is certified that error appears in the above-indentified patent and that said Letters Patent is hereby corrected as shown below:

Column 3 line 7                          "Barik" should be
--Bank--;

Column 5, line 22                       "raphical" should be
--graphical--

Column 5, line 34                       "1/2" should be
--1/4--;

Column 31, line 41                      "set" should be
--sets--;

Column 31, line 48                      "set" should be
--sets--;

Column 31, line 49                      "efficient" should be
--coefficients--;

Column 35, line 22                      "modified ample" should be
--modified-sample--;

UNITED STATES PATENT AND TRADEMARK OFFICE
CERTIFICATE OF CORRECTION

PATENT NO. : 5,297,236            Page 2 of 2
DATED     : 3/22/94
INVENTOR(S) : Michael B. Antill, Grant A. Davidson It is certified that error appears in the above-indentified patent and that said Letters Patent is hereby corrected as shown below:

Column 35, line 23           "modified amp e" should be
 --modified-sample--;

Column 35, line 25           "analysis window" should be
 --analysis-window--.

Signed and Sealed this

Twenty-fifth Day of March, 1997

Attest:

BRUCE LEHMAN

*Attesting Officer*      Commissioner of Patents and Trademarks